(12) United States Patent
Hatanaka

(10) Patent No.: US 7,459,887 B2
(45) Date of Patent: Dec. 2, 2008

(54) VOLTAGE DETECTION CIRCUIT, OVERCURRENT DETECTION CIRCUIT, CHARGING CURRENT CONTROL SYSTEM, AND VOLTAGE DETECTION METHOD

(75) Inventor: Tadata Hatanaka, Yokohama (JP)

(73) Assignee: Panasonic Corporation, Osaka (JP)

( * ) Notice: Subject to any disclaimer, the term of this patent is extended or adjusted under 35 U.S.C. 154(b) by 429 days.

(21) Appl. No.: 11/258,743

(22) Filed: Oct. 26, 2005

(65) Prior Publication Data

US 2006/0113969 A1 Jun. 1, 2006

(30) Foreign Application Priority Data

Oct. 29, 2004 (JP) ............................. 2004-317237

(51) Int. Cl.
*H02J 7/06* (2006.01)
(52) U.S. Cl. ...................................... 320/164; 320/162
(58) Field of Classification Search ................. 320/119, 320/124, 132, 164, 166; 323/212
See application file for complete search history.

(56) References Cited

U.S. PATENT DOCUMENTS

| | | | | |
|---|---|---|---|---|
| 4,041,386 A | * | 8/1977 | Thomas et al. ........... | 324/76.18 |
| 4,792,743 A | * | 12/1988 | Tsujino et al. ............. | 320/124 |
| 5,049,804 A | * | 9/1991 | Hutchings .................. | 320/110 |
| 5,345,422 A | * | 9/1994 | Redwine ................ | 365/189.09 |
| 5,442,274 A | * | 8/1995 | Tamai ........................ | 320/146 |
| 5,896,025 A | * | 4/1999 | Yamaguchi et al. ......... | 320/134 |
| 6,369,460 B1 | * | 4/2002 | Endoh et al. .................. | 307/31 |
| 2002/0105833 A1 | * | 8/2002 | Aoyama et al. ........ | 365/185.24 |

FOREIGN PATENT DOCUMENTS

| | | |
|---|---|---|
| EP | 1 136 835 A1 | 9/2001 |
| EP | 1 279 928 A2 | 1/2003 |
| JP | 2001-337147 | 12/2001 |
| JP | 2003-043123 | 2/2003 |

* cited by examiner

*Primary Examiner*—Akm E Ullah
*Assistant Examiner*—M'Baye Diao
(74) *Attorney, Agent, or Firm*—RatnerPrestia

(57) ABSTRACT

A voltage detection circuit detects an input voltage in first and second periods to average by using a switch circuit and a sampling circuit. At this time, the input voltage of the second period is added to the input voltage of the first period so that a polarity of variations is opposite, the variations being in relative errors of a plurality of resistors for dividing the input voltage, in input offset voltages of a voltage amplifier for amplifying an inputted minute voltage, and in input offset voltages of a comparator for comparing an amplified voltage value with a certain level.

22 Claims, 13 Drawing Sheets

VOLTAGE DETECTION CIRCUIT, OVERCURRENT DETECTION CIRCUIT, CHARGING CURRENT CONTROL SYSTEM, AND VOLTAGE DETECTION METHOD

BACKGROUND OF THE INVENTION

1. Field of the Invention

The present invention relates to a voltage detection circuit for high-accurately detecting a voltage between two inputs, an overcurrent detection circuit having the voltage detection circuit, a charging current control system having the voltage detection circuit, and a voltage detection method for those circuits and system.

2. Related Art

In recent years, for the purpose of enhancing safety of equipment which is driven by a charging battery, such as a mobile phone, a demand exists for preventing flowing of an abnormal current from a charging battery to equipment and the subsequent overheating of the equipment during the use thereof. For that purpose, a fuse has hitherto been inserted between the charging battery and a component of the equipment. However, the fuse will not return to the former state once blowout. Hence an overcurrent detection circuit, which high-accurately detects the current flowing from the charging battery to the equipment, is increasingly required in place of the fuse.

In the case of detecting the current flowing from the charging battery to the equipment, a micro-resistor in such a degree as to have no influence on battery characteristic is typically inserted into a line along which the current flows from the charging battery to the equipment. Then, a voltage detection circuit detects minute voltages generated at both ends of the resistor.

Further, it is recently sought, when charging in the charging battery by use of an AC adaptor, to control the charging current flowing from the AC adaptor to the charging battery. This has required a charging current control system for high-accurately detecting the current flowing from the AC adaptor to the charging battery.

In the case of detecting the current flowing from the AC adaptor to the charging battery, a micro-resistor in such a degree as to have no influence on battery characteristics is typically inserted into a line along which-the current flows from the AC adaptor to the charging battery. Then the voltage detection circuit detects minute voltages generated at both ends of the resistor.

A voltage detection circuit to be used for an overcurrent detection circuit and a charging current control system requires to include a plurality of resistors for dividing an inputted voltage by resistance division, a voltage amplifier for amplifying the inputted minute voltage, and a comparator for comparing the amplified voltage value with a certain level to decide whether the voltage value is equal to/higher than the certain level.

The voltage value generated at each terminal of the resistor and inputted into the voltage detection circuit is excessively minute. Thereby, variations in relative errors of the plurality of resistors for dividing the inputted voltage cause variations in detected values outputted from the voltage detection circuit. Variations in input offset voltage of the voltage amplifier for amplifying the inputted minute voltage cause variations in detected values outputted from the voltage detection circuit. Variations in input offset voltage of the comparator, for comparing the amplified voltage value with a certain level to decide whether the voltage value is equal to/higher than the certain level, cause variations in detected values outputted from the voltage detection circuit.

There has been a problem due to these causes in that the conventional voltage detection circuit is not capable of outputting an accurate detection value. The same problem also occurs in an overcurrent detection circuit having the conventional voltage detection circuit, a charging current control system having the conventional voltage detection circuit, and a voltage detection method for those circuits and system.

SUMMARY OF THE INVENTION

It is an object of the present invention to solve the above problem and provide a voltage detection circuit and a voltage detection method in which a voltage is detected high-accurately even when a voltage value as an object to be detected is minute.

It is an object of the present invention to provide an overcurrent detection circuit and a charging current control system each having the above-mentioned voltage detection circuit and functions.

For solving the above-mentioned problem, the present invention has the following constitution.

A voltage detection circuit of an aspect of the present invention includes: a first input terminal that inputs a first input voltage; a second input terminal that inputs a second input voltage; a third input terminal to provide a ground potential; a voltage divider circuit having a first serial resistor and a second serial resistor, the first resister having a plurality of resistors connected in series and a first voltage dividing terminal at the intermediate connecting point of the plurality of resistors, the second serial resistor having a plurality of resistors connected in series and a second voltage dividing terminal at the intermediate connecting point of the plurality of resistors; and a first switch circuit which inputs a signal having a first period and a second period to switch the state of connection of each of the input terminals to the first serial resistor and the second serial resistor in the first period and the second period, wherein, in the first period, the first switch circuit connects the first input terminal to one end of the first serial resistor, connects the second input terminal to one end of the second serial resistor, and connects the third input terminal to the other end of the first serial resistor and the other end of the second serial resistor, and in the second period, the first switch circuit connects the third input terminal to one end of the first serial resistor and one end of the second serial resistor, connects the first input terminal to the other end of the first serial resistor, and connects the second input terminal to the other end of the second serial resistor.

According to this invention, relative errors of resistances of the first serial resistor and the second serial resistor can be mutually cancelled by addition of a voltage difference (between a voltage (first divided voltage) of the first voltage dividing terminal and a voltage (second divided voltage) of the second voltage dividing terminal) outputted from the voltage divider circuit in the first period to a voltage difference (between a voltage (first divided voltage) of the first voltage dividing terminal and a voltage (second divided voltage) of the second voltage dividing terminal) outputted in the second period. This allows only an effective component of the voltage to be left, and this effective component is doubled. The use of the first divided voltage and the second divided voltage in the first and the second periods enables production of a detection signal including no relative error. According to this prevention, it is possible to realize a voltage detection circuit in which a voltage is detected high accurately, without being influenced by a relative error of a resistance in a voltage divider circuit.

The voltage detection circuit according to another aspect of the present invention may further include: a voltage amplifier which inputs a voltage of each of the first voltage dividing terminal and the second voltage dividing terminal to amplify each inputted voltage; and a second switch circuit which inverts the state of connection of the first voltage dividing terminal and the second voltage dividing terminal to the voltage amplifier in the first period and the second period.

In case that the voltage amplifier is constituted of two operational amplifiers, in the first period, the voltage (first divided voltage) of the first voltage dividing terminal is inputted into one of the operational amplifiers and the voltage (second divided voltage) of the second voltage dividing terminal is inputted into the other of the operational amplifiers. In the second period, the second divided voltage is inputted into one of the operational amplifiers and the first divided voltage is inputted into the other of the operational amplifiers. Since the voltage amplifier amplifies the inputted voltage as it is and then outputs the amplified voltage, the first divided voltage and the second divided voltage multiplied by gain in the first and second periods are respectively outputted from the two different operational amplifiers.

The voltage to be outputted from the voltage amplifier includes respective input offset voltages of two operational amplifiers constituting the voltage amplifier. The two operational amplifiers respectively output the same input offset voltages in the first and the second periods.

Therefore, these input offset voltages are mutually cancelled for example by addition of a voltage difference (obtained by subtracting an output voltage of the other of the operational amplifiers from an output voltage of one of the operational amplifier) in the first period to a voltage difference (a value obtained by subtracting an output voltage of one of the operational amplifiers from an output voltage of the other of the operational amplifier) which is inverted positive and negative in the second period. Only the difference between the first and the second divided voltages having been multiplied by gain is left, and this difference value is doubled.

According to this invention, it is possible to realize a voltage detection circuit in which a voltage is detected high-accurately, without being influenced by the input offset voltage of the voltage amplifier.

In the voltage detection circuit according to another aspect of the present invention, the power source voltage of the voltage amplifier may be the first input voltage.

In this invention, a voltage inputted from the first input terminal is divided in the voltage divider circuit and the divided voltage is then inputted into the voltage amplifier. It is thus possible to allow the first input voltage to provide a power source voltage of the voltage amplifier.

The voltage detection circuit according to another aspect of the present invention may further include: a first storage circuit having a first switch device connected to one output terminal of the voltage amplifier and a first storage device connected between the other output terminal of the voltage amplifier and the first switch device.

In this invention, since the first switch device closes for the first period, the first storage device stores a voltage difference between the two outputs of the voltage amplifier. Since the first switch device opens for the second period, a voltage difference between the two outputs of the voltage amplifier is added with the voltage stored in the first storage device in the first period. The present invention can cancel the relative error of the resistance of the voltage divider circuit and the input offset voltage of the voltage amplifier, respectively. The voltage outputted from the first storage circuit in the second period is a voltage value obtained by addition of the respective voltages outputted from the voltage amplifier for the first and the second periods, and an effective signal component is doubled.

The voltage detection circuit according to another aspect of the present invention may further include: a comparator having a positive electrode input terminal which inputs a voltage of one output terminal of the voltage amplifier via the first storage device, and a negative electrode input terminal inputs a voltage of the other output terminal of the voltage amplifier; and a third switch circuit which is provided between the voltage amplifier and the comparator and controls an input into the comparator.

According to this invention, since the third switch circuit opens for the first period, the first storage circuit and the comparator are disconnected from one another. This makes it possible to store a voltage difference between the two output terminals of the voltage amplifier into the first storage device of the first storage circuit for the first period.

Since the third switch circuit closes for the second period, the positive electrode input terminal of the comparator inputs a voltage obtained by addition of a voltage outputted from one of the output terminals of the voltage amplifier in the second period to the voltage stored in the first storage device. The negative electrode input terminal of the comparator inputs a voltage outputted from the other output terminal of the voltage amplifier in the second period.

According to this invention, when the comparator compares respective voltages inputted from the positive electrode input terminal and the negative electrode input terminal thereof, the relative error of the voltage divider circuit and the input offset voltage of the voltage amplifier are cancelled. According to this invention, it is possible to realize a voltage detection circuit in which a voltage is detected high-accurately, without being influenced by the relative error of the resistance of the voltage divider circuit and the input offset voltage of the voltage amplifier.

The voltage detection circuit according to another aspect of the present invention may further include: a second storage circuit having a second storage device connected between the third switch circuit and the negative electrode input terminal of the comparator, and a second switch device for connecting the output terminal and the negative electrode input terminal of the comparator in the first period; and a threshold setting circuit that has one end which is connected to the second storage device and the other end which is connected to the positive electrode input terminal of the comparator, and outputs a threshold voltage in the first period.

In the first period, one end of the threshold setting circuit is connected to one end of the second storage device, and the other end of the threshold setting circuit is connected to the other end of the second storage device via the comparator. This permits the second storage device to store the sum of the threshold voltage and the input offset voltage of the comparator.

In the second period, the negative electrode input terminal of the comparator inputs a voltage stored in the second storage device. According to this invention, the input offset voltage of the comparator, having been stored into the second storage device in the first period, and the input offset voltage when the comparator makes a comparison in the second period are mutually cancelled.

According to this invention, it is possible to realize a voltage detection circuit in which a voltage is detected high-accurately, without being influenced by an input offset voltage of a comparator for comparing an amplified voltage value with a certain level to decide whether the voltage value is equal to/higher than the certain level.

The voltage detection circuit according to another aspect of the present invention may further include a latch circuit that has a data input terminal and a clock input terminal and an output terminal, wherein the data input-terminal inputs the output of the comparator, and the clock input terminal inputs a latch signal for latching a signal inputted into the data input terminal in the second period.

According to this invention, since a signal latched in the second period can be outputted during a period until the next latch, it is possible to halt an operation of each of the circuits within the voltage detection circuit other than the latch circuit during between the second period and the next first period. According to this invention, it is possible to realize a voltage detection circuit with low consumption.

The voltage detection circuit of another aspect of the present invention, wherein the threshold setting circuit may input the output signal of the latch circuit to change a threshold voltage value based on the output signal of the latch circuit.

According to this invention, it is possible to allow the comparison level of the comparator to have hysteresis, and thus to operate stably.

In the voltage detection circuit according to another aspect of the present invention, the first period and the second period may be intermittently alternately repeated, and a waiting period may be provided between the second period and the first period.

Here, the "waiting period" means a period between the second period and the next first period. In this waiting period, the latch circuit outputs a signal latched in the second period. In the waiting period, all the switch devices come into the open state and each of the circuits within the voltage detection circuit is halted.

According to this invention, an intermittent operation can be performed which halts the operation of each of the circuits other than the latch circuits between the second period and the first period, thereby making it possible to realize a voltage detection circuit with low consumption.

The voltage detection circuit according to another aspect of the present invention may further include a first sampling circuit that has: a first operational amplifier having two input terminals and two output terminals; a third storage circuit connected to the voltage amplifier and the first operational amplifier; a fourth switch circuit that switches connections so that, in the first period, each of the output terminals of the voltage amplifier is connected to each of the input terminals of the first operational amplifier, and each of the output terminals of the first operational amplifier is connected to the third storage circuit, and while, in the second period, a voltage of one of the output terminals of the voltage amplifier is inputted into one of the input terminals of the first operational amplifier via the third storage circuit and a voltage of the other of the output terminals of the voltage amplifier is inputted into the other of input terminals of the first operational amplifier; and a fourth storage circuit that is connected to the first operational amplifier to store a voltage difference between the two output terminals of the first operational amplifier in the second period, and outputs a value obtained by adding the voltage difference to a reference voltage to an external output terminal for the next first period.

According to this invention, it is possible to output, in the first period, a voltage proportional to a difference between respective voltages inputted from the first input terminal and the second input terminal. According to this invention, it is possible to mutually cancel the relative error of the voltage divider circuit, the input offset voltage of the voltage amplifier, and the input offset voltage of the first operational amplifier, so as to output a voltage.

The voltage detection circuit according to another aspect of the present invention may further include a second sampling circuit, having: a second operational amplifier having two input terminals and two output terminals; a fifth storage circuit connected to the voltage amplifier and the second operational amplifier; a fifth switch circuit that switches connections so that, in the second period, each of the output terminals of the voltage amplifier is connected to each of the input terminals of the second operational amplifier, and each of the output terminals of the second operational amplifier is connected to the fifth storage circuit, while, in the first period, a voltage of one of the output terminals of the voltage amplifier is inputted into one of the input terminals of the second operational amplifier via the fifth storage circuit and a voltage of the other of the output terminals of the voltage amplifier is inputted into the other of input terminals of the second operational amplifier; and a sixth storage circuit that is connected to the second operational amplifier to store a voltage difference between the two output terminals of the second operational amplifier in the first period, and outputs a value obtained by adding the voltage difference to a reference voltage to the external output terminal for the second period.

According to this invention, it is possible to output, in the second period, a voltage proportional to a difference between respective voltages inputted from the first input terminal and the second input terminal. According to this invention, it is possible to mutually cancel the relative error of the voltage divider circuit, the input offset voltage of the voltage amplifier, and the input offset voltage of the second operational amplifier, so as to output a voltage.

With both the first sampling circuit and the second sampling circuit built in the voltage detection circuit, it is possible to output a voltage proportional to the difference between respective voltages inputted from the first input terminal and the second input terminal for both the first and the second periods.

In the voltage detection circuit according to another aspect of the present invention, each of the input terminals of the second operational amplifier may be connected with each of the output terminals of the voltage amplifier in the same state of connection as the first operational amplifier, and the sixth storage circuit may be connected with the reference voltage and the external output terminal in the opposite state of connection to the fourth storage circuit.

In the voltage detection circuit according to another aspect of the present invention, each of the input terminals of the second operational amplifier may be connected with each of the output terminals of the voltage amplifier in the opposite state of connection to the first operational amplifier, and the sixth storage circuit may be connected with the reference voltage and the external output terminal in the same state of connection as the fourth storage.

An overcurrent detection circuit of the present invention includes: a detection resistor provided between a charging battery and an equipment to be driven by applied a voltage from the charging battery; a third switch device connected in series with the detection resistor; and the above-mentioned voltage detection circuit which inputs voltages across the detection resistor and outputs a signal for controlling an open/close operations of the third switch device.

According to this invention, the voltage detection circuit can high-accurately detect a difference between voltages across the detection resistor so as to prevent flowing of an overcurrent from the charging battery to the equipment.

A charging current control system of the present invention includes: a charging battery which is supplied with a charging current from an external power source so as to be charged; a charging current control circuit connected between the external power source and the charging battery; a detection resistor connected in series with the charging current control circuit; and the above-mentioned voltage detection circuit which is connected with both ends of the detection resistor and outputs a detection signal based on the voltage of the detection resistor to the charging current control circuit, wherein the charging current control circuit controls a value of the charging current based on the detection signal of the voltage detection circuit.

According to this invention, the voltage detection circuit can high-accurately detect a difference between voltages across the detection resistor so as to prevent overflowing of a charging current from the external power source to the charging battery.

A voltage detection method of one aspect of the present invention is a voltage detection method by use of a voltage detection circuit including: a first input terminal that inputs a first input voltage; a second input terminal that inputs a second input voltage; a third input terminal to provide a ground potential; a voltage divider circuit having a first serial resistor and second serial resistor, the first serial resistor having a plurality of resistors connected in series and a first voltage dividing terminal at the intermediate connecting point of the plurality of resistors, the second serial resistor having a plurality of resistors connected in series and a second voltage dividing terminal at the intermediate connecting point of the plurality of resistors; and a first switch circuit which inputs a signal having a first period and a second period to switch the state of connection of each of the input terminals to the first serial resistor and the second serial resistor in the first period and the second period; wherein the voltage detection method includes: in the first period, connecting the first input terminal to one end of the first serial resistor, connecting the second input terminal to one end of the second serial resistor, and connecting the third input terminal to the other end of the first serial resistor and the other end of the second serial resistor; and in the second period, connecting the third input terminal to one end of the first serial resistor and one end of the second serial resistor, connecting the first input terminal to the other end of the first serial resistor, and connecting the second input terminal to the other end of the second serial resistor.

In this invention, relative errors of resistances of the first serial resistor and the second serial resistor can be mutually cancelled by addition of the difference between the voltage of the first voltage dividing terminal and the voltage of the second voltage dividing terminal in the first period to the difference between the voltage of the first voltage dividing terminal and the voltage of the second voltage dividing terminal in the second period.

According to this invention, a voltage detection method can detect a voltage high-accurately without being influenced by the relative error of the resistance of the voltage divider circuit.

The voltage detection method according to another aspect of the present invention may further include: inputting a voltage of each of the first voltage dividing terminal and the second voltage dividing terminal into a voltage amplifier, to amplify each inputted voltage; and inverting the state of connection of the first voltage dividing terminal and the second voltage dividing terminal to the voltage amplifier by a second switch circuit in the first period and the second period.

When the voltage amplifier is constituted of two operational amplifiers, in the first period, one of the operational amplifiers inputs the voltage (first divided voltage) of the first voltage dividing and the other of the operational amplifiers inputs the voltage (second divided voltage) of the second voltage dividing. In the second period, one of the operational amplifiers inputs the second divided voltage and the other of the operational amplifiers inputs the first divided voltage. Since the voltage amplifier amplifies the inputted voltage as it is and then outputs the amplified voltage, two different operational amplifiers outputs the first divided voltage and the second divided voltage multiplied by gain in the first and second periods respectively.

The voltage to be outputted from the voltage amplifier includes respective input offset voltages of two operational amplifiers constituting of the voltage amplifier. The two operational amplifiers respectively output the same input offset voltages in the first and the second periods.

Therefore, these input offset voltages are mutually cancelled for example by addition of a voltage difference (obtained by subtracting an output voltage of the other of the operational amplifiers from an output voltage of one of the operational amplifier) in the first period to a voltage difference (obtained by subtracting an output voltage of one of the operational amplifiers from an output voltage of the other of the operational amplifier) which is inverted positive and negative electrode in the second period. Only the difference between the first and the second divided voltages having been multiplied by gain is left, and this difference value is doubled.

According to this invention, a voltage detection method can detect a voltage high-accurately without being influenced by the input offset voltage of the voltage amplifier.

The voltage detection method according to another aspect of the present invention may further include closing a first switch device connected to one of the output terminals of the voltage amplifier, to store a voltage to be outputted from the voltage amplifier into a first storage device connected between the first switch device and the other of output terminals of the voltage amplifier, in the first period.

According to this invention, since a voltage difference between the two outputs of the voltage amplifier is stored into the first storage device in the first period, it is possible to output a voltage obtained by addition of a voltage difference between the two outputs of the voltage amplifier in the second period to the voltage stored in the first storage device in the first period. Thereby, the relative errors of the resistances, respectively constituting the first serial resistor and the second serial resistor, can be cancelled. The input offset voltage of the voltage amplifier can be cancelled.

The voltage detection method according to another aspect of the present invention may further include: switching a third switch circuit so as to input a voltage of one of the output terminals of the voltage amplifier into a positive electrode input terminal of a comparator via the first storage device, and input a voltage of the other of the output terminals of the voltage amplifier into a negative electrode input terminal of the comparator, in the second period; and comparing two voltages inputted by the comparator.

According to this invention, it is possible to compare without being influenced by the relative errors of the resistances respectively of the first serial resistor and the second serial resistor and the input offset voltage of the voltage amplifier.

Further, with the second storage device for storing an input offset voltage of the comparator provided between the third switch circuit and the negative electrode input terminal of the comparator, it is possible to mutually cancel the input offset voltage of the comparator, having been stored into the second storage device in the first period, and the input offset voltage when the comparator makes a comparison in the second period.

The voltage detection method according to another aspect of the present invention may further include: in the first period, connecting each of the output terminals of the voltage amplifier to each of the input terminals of a first operational amplifier, and also connecting each of the output terminals of the first operational amplifier to a third storage circuit; in the second period, inputting a voltage of one of the output terminals of the voltage amplifier into one of the input terminals of the first operational amplifier via the third storage circuit, and also inputting a voltage of the other of the output terminals of the voltage amplifier into the other of input terminals of the first operational amplifier; and connecting a fourth storage circuit to the first operational amplifier to store a voltage difference between the two output terminals of the first operational amplifier in the second period, and then outputting a value obtained by adding the voltage difference to a reference voltage, in the next first period.

According to this invention, it is possible to output, in the first period, a voltage proportional to a difference between respective voltages inputted from the first input terminal and the second input terminal. According to this invention, it is possible to mutually cancel the relative error of the voltage divider circuit, the input offset voltage of the voltage amplifier, and the input offset voltage of the first operational amplifier, so as to output a voltage.

The voltage detection method according to another aspect of the present invention may further include: in the second period, connecting each of the output terminals of the voltage amplifier to each of the input terminals of a second operational amplifier, and also connecting each of the output terminals of the second operational amplifier to a fifth storage circuit; in the first period, inputting a voltage of one of the output terminals of the voltage amplifier into one of the input terminals of the second operational amplifier via the fifth storage circuit, and also inputting a voltage of the other of the output terminals of the voltage amplifier into the other of input terminals of the second operational amplifier; and connecting a sixth storage circuit to the second operational amplifier to store a voltage difference between the two output terminals of the second operational amplifier in the first period, and then outputting a value obtained by adding the voltage difference to a reference voltage, in the second period.

According to this invention, it is possible to output, in the second period, a voltage proportional to a difference between respective voltages inputted from the first input terminal and the second input terminal. According to this invention, it is possible to mutually cancel the relative error of the voltage divider circuit, the input offset voltage of the voltage amplifier, and the input offset voltage of the second operational amplifier respectively, so as to output a voltage.

According to the present invention, it is possible to obtain an advantageous effect of being able to realize, in a low consumption current, a voltage detection circuit and a voltage detection method in which a voltage is detected high-accurately even when a voltage value as an object to be detected is minute.

According to the present invention, it is possible to obtain an advantageous effect of being able to realize that an overcurrent detection circuit having the voltage detection circuit prevents overcurrent flowing from a charging battery to equipment.

According to the present invention, it is possible to obtain an advantageous effect of being able to realize that a charging current control system having the voltage detection circuit controls a value of a charge current flowing from an external power source to a charging battery.

DETAILED DESCRIPTION OF THE PREFERRED EMBODIMENTS

In the following, embodiments which concretely show the best mode for implementing the present invention are described along with drawings.

Embodiment 1

Figure 1:
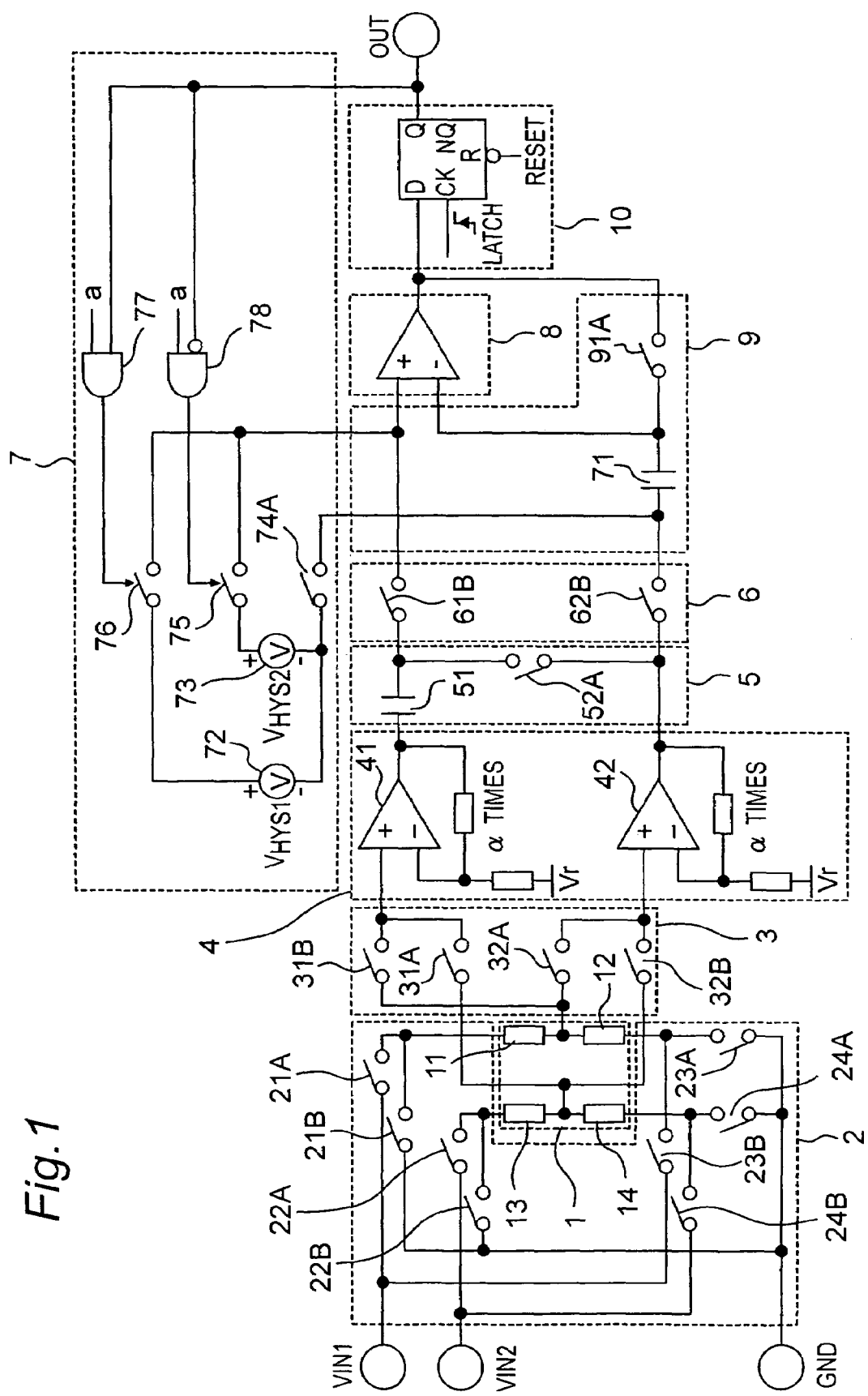
FIG. 1 is a block diagram showing a configuration of a voltage detection circuit according to an embodiment 1 of the present invention.
Figure 2:
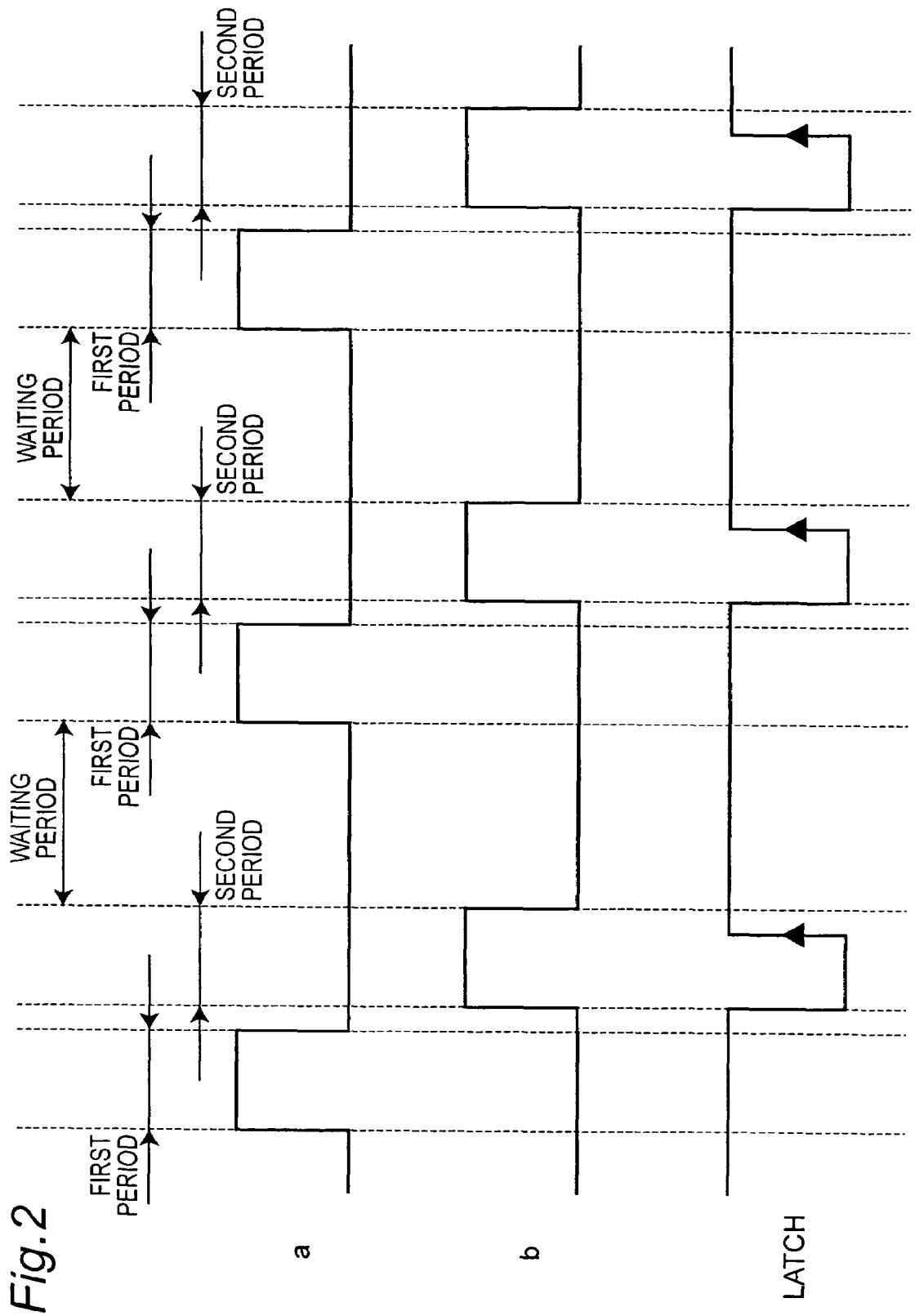
FIG. 2 is a timing chart for synchronized signals to be applied to voltage detection circuits according to embodiments 1 to 4 of the present invention.

A voltage detection circuit and a voltage detection method according to an embodiment 1 of the present invention are described with reference to FIGS. 1 to 4. FIG. 1 is a block diagram showing the configuration of the voltage detection circuit according to the embodiment 1 of the present invention. FIG. 2 is a timing chart for synchronized signals to be applied to the voltage detection circuits according to the embodiment 1 of the present invention.

As shown in FIG. 1, the voltage detection circuit according to the embodiment 1 of the present invention has an input terminal VIN1 which inputs a first input voltage (V1), an input terminal VIN2 which inputs a second input voltage (V2) as a lower potential than the first input voltage, a GND terminal to provide a ground potential, a voltage divider circuit 1 which divides respectively voltages inputted from the input terminals VIN1 and VIN2, a switch circuit 2 (first switch circuit) which switches the connection of the input terminals VIN1/VIN2 and the GND terminal with the voltage divider circuit 1, a switch circuit 3 (second switch circuit) which switches the connection of the voltage divider circuit 1 with a voltage amplifier 4, the voltage amplifier 4 which inputs a voltage outputted from the switch circuit 3 to amplify the voltage, a storage circuit 5 (first storage circuit) which stores an output voltage of the voltage amplifier 4, a switch circuit 6 (third switch circuit) which is connected with the storage circuit 5 and synchronizes with a second signal to switch on/off, a threshold setting circuit 7 which outputs a threshold voltage, a comparator 8 which compares the threshold voltage with a value obtained by addition of the voltage of the storage circuit 5 to the output voltage of the voltage amplifier 4, a storage circuit 9 (second storage circuit) which is connected between the switch circuit 6 and the comparator 8 to store the threshold voltage, a latch circuit 10 which latches the output of the comparator 8 to output a signal, and an external output terminal OUT which outputs the output signal of the latch circuit 10 to the outside.

Each switch device of the voltage detection circuit according to the embodiment 1 of the present invention synchronizes with a first signal "a" or a second signal "b" shown in FIG. 2. The fist signal "a", the second signal "b" and a LATCH signal are provided from a signal generator (not shown in the figure). For example, the signal generator is included in components on an IC mounting the voltage detection circuit. In place of the signal generator mounted on the IC, the first signal "a", the second signal "b" and the LATCH signal may be provided from an external signal generator.

Each of the switch devices is closed while the signal is High and is opened while the signal is Low. In FIG. 2, a period when the first signal "a" is High and the second signal "b" is Low is referred to as "a first period", and a period when the first signal "a" is Low and the second signal "b" is High is referred to as "a second period". A period between the second and the first periods is referred to as "a waiting period".

Each of the constituents of the voltage detection circuit in FIG. 1 and connections among those constituents are described.

The voltage divider circuit 1 has a first serial resistor constituted of a first resistor 11 and a second resistor 12 connected in series, and a second serial resistor constituted of a third resistor 13 and a fourth resistor 14 connected in series. In the embodiment 1, those four resistors 11 to 14 have the same resistance value.

The first serial resistor (resistors 11 and 12), both ends of which are connected to the input terminal VIN1 and the GND terminal, outputs a divided voltage (first divided voltage) from the connecting point (referred to as "a first voltage dividing terminal") between the first resistor 11 and the second resistor 12.

The second serial resistor (resistors 13 and 14), both ends of which are connected to the input terminal VIN2 and the GND terminal, outputs a divided voltage (second divided voltage) from the connecting point (referred to as "a second voltage dividing terminal") between the third resistor 13 and the fourth resistor 14.

The switch circuit 2 (first switch circuit) connects one end of the first serial resistor of the voltage divider circuit 1 with the input terminal VIN1, and the other end of the first serial resistor with the GND terminal. Further, the switch circuit 2 connects one end of the second serial resistor of the voltage divider circuit 1 with the input terminal VIN2, and the other end of the second serial resistor with the GND terminal.

Specifically, the switch circuit 2 has eight switch devices 21A, 21B, 22A, 22B, 23A, 23B, 24A and 24B. Each of the eight switch devices switches on or off in the first and second periods, to invert the connections of both ends of the first serial resistor with the input terminal VIN1 and the GND terminal and the connections of both ends of the second serial resistor with the input terminal VIN2 and the GND terminal.

One end of the switch device 21A is connected to the resistor 11 and the other end thereof is connected to the input terminal VIN1, and the switch device 21A synchronizes with the first signal "a" to close.

One end of the switch device 21B is connected to the resistor 11 and the other end thereof is connected to the GND terminal, and the switch device 21B synchronizes with the second signal "b" to close.

One end of the switch device 22A is connected to the resistor 13 and the other end thereof is connected to the input terminal VIN2, and the switch device 22A synchronizes with the first signal "a" to close.

One end of the switch device 22B is connected to the resistor 13 and the other end thereof is connected to the GND terminal, and the switch device 22B synchronizes with the second signal "b" to close.

One end of the switch device 23A is connected to the resistor 12 and the other end thereof is connected to the GND terminal, and the switch device 23A synchronizes with the first signal "a" to close.

One end of the switch device 23B is connected to the resistor 12 and the other end thereof is connected to the input terminal VIN1, and the switch device synchronizes with the second signal "b" to close.

One end of the switch device 24A is connected to the resistor 14 and the other end thereof is connected to the GND terminal, and the switch device 24A synchronizes with the first signal "a" to close.

One end of the switch device 24B is connected to the resistor 14 and the other end thereof is connected to the input terminal VIN2, and the switch device 24B synchronizes with the second signal "b" to close.

The switch circuit 3 (second switch circuit) has four switch devices 31A, 31B, 32A and 32B.

One end of the switch device 31A is connected to the connecting point between the resistor 13 and the resistor 14, and the other end thereof is connected to an input terminal of a first operational amplifier 41 of a voltage amplifier 4, and the switch device 31A synchronizes with the first signal "a" to close.

One end of the switch device 31B is connected to the connecting point between the resistor 11 and the resistor 12, and the other end thereof is connected to the input terminal of the first operational amplifier 41 of a voltage amplifier 4, and the switch device 31B synchronizes with the second signal "b" to close.

One end of the switch device 32A is connected to the connecting point between the resistor 11 and the resistor 12, and the other end thereof is connected to an input terminal of a second operational amplifier 42 of a voltage amplifier 4, and the switch device 32A synchronizes with the first signal "a" to close.

One end of the switch device 32B is connected to the connecting point between the resistor 13 and the resistor 14, and the other end thereof is connected to the input terminal of the second operational amplifier 42 of a voltage amplifier 4, and the switch device 32B synchronizes with the second signal "b" to close.

The voltage amplifier 4 is constituted of two operational amplifiers.

A plus input terminal of the first operational amplifier 41 is connected to the switch device 31A and the switch device 31B and the first operational amplifier 41 multiples an inputted voltage by a to output the multiplied voltage.

A plus input terminal of the second operational amplifier 42 is connected to the switch device 32A and the switch device 32B and the second operational amplifier 42 multiples an inputted voltage by a to output the multiplied voltage.

The power source voltage of the first operational amplifier 41 and the second operational amplifier 42 may be the first input voltage inputted from the input terminal VIN1.

The storage circuit 5 (first storage circuit) has a storage device 51 (first storage device) and a switch device 52A (first switch device).

One end of the storage device 51 is connected with the output terminal of the first operational amplifier 41 of a voltage amplifier 4, and the other end thereof is connected with a switch device 61B.

One end of the switch device 52A is connected between the output terminal of the second operational amplifier 42 of the voltage amplifier 4 and a switch device 62B, and the other end thereof is connected between the storage device 51 and the switch device 61B. The switch device 52A of the storage circuit 5 synchronizes with the first signal "a" to close.

The switch circuit 6 (third switch circuit) has a switch device 61B and a switch device 62B.

One end of the switch device 61B is connected to the storage device 51 of the storage circuit 5, and the other end thereof is connected to the comparator 8.

One end of the switch device 62B is connected with the second operational amplifier of the voltage amplifier 4, and the other end thereof is connected with a second storage device 71.

The switch devices 61B and 62B of the switch circuit 6 synchronize with the second signal "b" to close.

The threshold setting circuit 7 has a first threshold setting voltage source 72 outputting a voltage $V_{HYS1}$, a second threshold setting voltage source 73 outputting a voltage $V_{HYS2}$, switch devices 74A, 75 and 76, a first logic device 77, and a second logic device 78.

The minus terminal of the first threshold setting voltage source 72 and the minus terminal of the second threshold setting voltage source 73 are connected to the switch device 74A. The switch device 74A synchronizes with the first signal "a" to close so as to connect the storage device 71 with the threshold setting voltage sources 72 and 73.

The plus terminal of the first threshold setting voltage source 72 is connected to one end of the switch device 76. The plus terminal of the second threshold setting voltage source 73 is connected to one end of the switch device 75.

The other ends of the switch devices 75 and 76 are connected with one another, and are also connected to the switch device 61B and the plus input terminal of the comparator 8.

The logic device 77 inputs the first signal "a" into one of input terminals thereof, and the other of the input terminals thereof is connected to an output Q of the latch circuit 10. The logic device 77 outputs High when the first signal "a" is High and the output Q of the latch circuit 10 is High.

The switch device 76 closes when the output of the logic device 77 is High, to connect the plus terminal of the first threshold setting voltage source 72 with the comparator 8.

The logic device 78 inputs the first signal "a" into one of input terminals thereof, and the other of the input terminals thereof inputs an inversion signal of the output Q of the latch circuit 10. The logic device 78 outputs High when the first signal "a" is High and the output Q of the latch circuit 10 is Low.

The switch device 75 closes when an output of the logic device 78 is High, to connect the plus terminal of the second threshold setting voltage source 73 with the comparator 8.

The storage circuit 9 (second storage circuit) has the storage device 71 (second storage device) and a switch device 91A (second switch device).

One end of the storage device 71 is connected to the switch device 62B and the switch device 74A, and the other end thereof is connected to the minus input terminal of the comparator 8 and the switch device 91A.

The switch device 91A synchronizes with the first signal "a" to close so as to connect the output terminal of the comparator 8 with the minus input terminal thereof.

The plus input terminal of the comparator 8 inputs a voltage on the plus side of the first threshold setting voltage source 72 or the second threshold setting voltage source 73 while the first signal "a" is High. The plus input terminal of the comparator 8 inputs the sum of the output voltage of the first operational amplifier 41 of the voltage amplifier 4 and a voltage stored in the storage device 51 via the switch circuit 61B, while the second signal "b" is High.

The minus input terminal of the comparator 8 is connected to the output terminal of the comparator 8 via the switch device 91A while the first signal "a" is High. The comparator 8 operates as a buffer amplifier. The minus input terminal of the comparator 8 inputs the sum of the output voltage of the second operational amplifier 42 of the voltage amplifier 4 and a voltage stored in the storage device 71 via the switch device 62B while the second signal "b" is High.

The comparator 8 compares differences in voltages inputted into the plus input terminal and the minus input terminal respectively, and outputs a binary output signal of High or Low from the output terminal thereof.

The power source voltage of the comparator 8 may be the first input voltage inputted from the input terminal VIN1.

While the first signal "a" is High, the output terminal of the comparator 8 is connected with the storage device 71 due to the conduction of the switch device 91A. The comparator 8 outputs a voltage obtained by adding an input offset voltage of the comparator 8 to the voltage (outputted from the first threshold setting voltage source 72 or the second threshold setting voltage source 73) applied to the plus input terminal.

Both ends of the storage device 71 inputs a voltage on the minus side of the threshold setting voltage source 72 or 73, and a voltage obtained by adding the input offset voltage of the comparator 8 to the voltage on the plus side of the threshold setting voltage source 72 or 73. The voltages applied to both ends of the storage device 71 correspond to a threshold value for detecting the intensity of a detection voltage.

The threshold setting circuit 7 can vary a threshold voltage to be applied to both ends of the storage device 71 in accordance with the output signal of the latch circuit 10, thereby providing a hysteresis to the comparison level of the comparator 8.

The output terminal of the comparator 8 is connected to a data input terminal D of the latch circuit 10. The latch circuit 10 inputs a latch signal LATCH (third signal) into a clock input terminal CK. As shown in FIG. 2, the latch signal LATCH indicates the timing for latching within the second period. The latch circuit 10 synchronizes with a rising edge of the latch signal input into the clock input terminal CK, to latch a value of the data input terminal D into the output terminal Q. The output terminal Q of the latch circuit 10 is connected to an external output terminal OUT.

The external output terminal OUT outputs the output signal of the latch circuit 10. This is a detection signal to be outputted from the voltage detection circuit.

Figure 3:
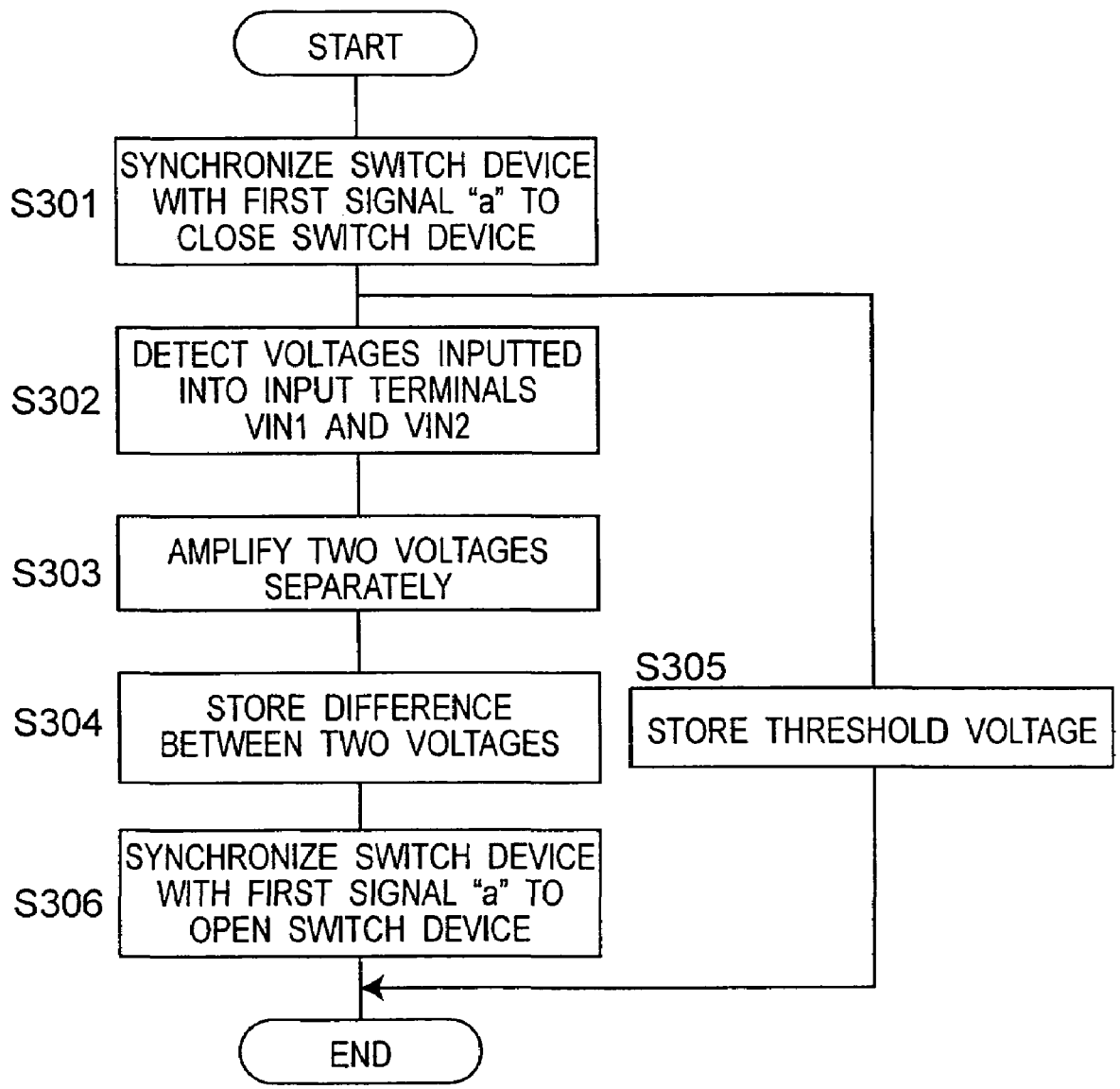
FIG. 3 is a flow chart for a first period of a voltage detection method according to an embodiment 1 of the present invention.
Figure 4:
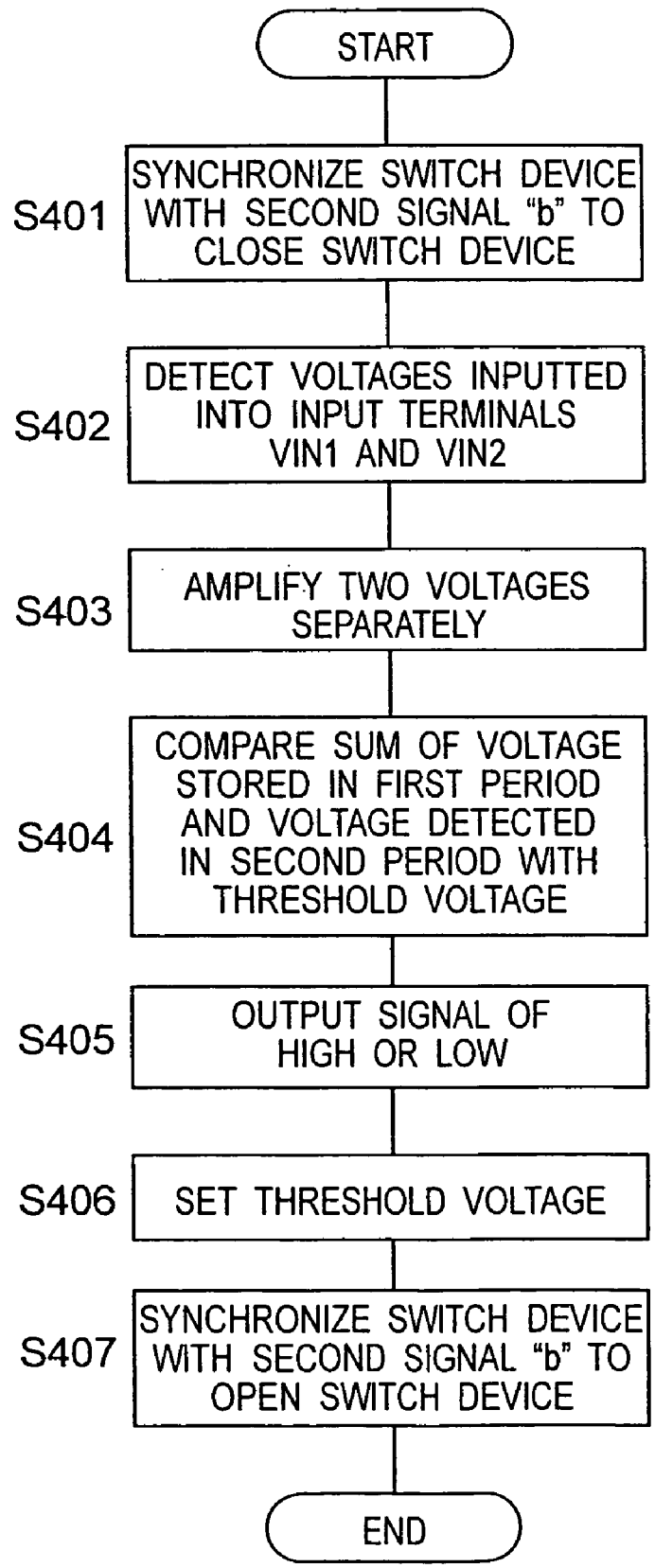
FIG. 4 is a flow chart for a second period of the voltage detection method according to the embodiment 1 of the present invention.

A voltage detection method is described below with reference to FIGS. 3 and 4, the method using the voltage detection circuit according to the embodiment 1 of the present invention, which is constituted as above described. FIG. 3 is a flow chart for the first period of the voltage detection method according to the embodiment 1 of the present invention. FIG. 4 is a flow chart for the second period of the voltage detection method according to the embodiment 1 of the present invention.

First, the first period (as shown in FIG. 3), in which the first signal "a" is High, is described. When the first signal "a" is High, the switch devices 21A, 22A, 23A, 24A, 31A, 32A, 52A, 74A and 91A, and either the switch device 75 or 76 are conducted (Step 301).

Due to the conduction of the switch device 21A and the switch device 23A, the input terminal VIN1 is connected with the resistor 11, and the resistor 12 is connected with the GND terminal. Due to the conduction of the switch device 22A and the switch device 24A, the input terminal VIN2 is connected with the resistor 13, and the resistor 14 is connected with the GND terminal.

A first divided voltage $V_{(1)11\text{-}12}$ is outputted from the connecting point between the resistor 11 and the resistor 12, and a second divided voltage $V_{(1)13\text{-}14}$ is outputted from the connecting point between the resistor 13 and the resistor 14 (Step 302).

Due to the conduction of the switch device 32A, the second operational amplifier 42 inputs the first divided voltage $V_{(1)11\text{-}12}$. Due to the conduction of the switch device 31A, the first operational amplifier 41 inputs the second divided voltage $V_{(1)13\text{-}14}$.

Although the resistors 11, 12, 13 and 14 have the same resistance value, the resistance values disperse in reality. A relative error is included in the voltage $V_{(1)11\text{-}12}$ divided by the resistors 11 and 12, and/or the voltage $V_{(1)13\text{-}14}$ divided by the resistors 13 and 14. The voltage $V_{(1)11\text{-}12}$ is the sum of the effective signal component and the relative error of the resistors 11 and 12. The voltage $V_{(1)13\text{-}14}$ is the sum of the effective signal component and the relative error of the resistors 13 and 14. The voltages including the relative errors are respectively inputted into the operational amplifiers 41 and 42 of the voltage amplifier 4 for the first period.

The operational amplifiers 41 and 42 of the voltage amplifier 4 each amplify an inputted voltage and then output the amplified voltage (Step 303). Voltages outputted from the operational amplifiers 41 and 42 include input offset voltages $V_{off1}$ and $V_{off2}$, respectively.

Since the switch device 52A is closed and the switch devices 61B and 62B are opened, output voltages of the operational amplifiers 41 and 42 of the voltage amplifier 4 are applied to both ends of the storage device 51.

The storage device 51 stores a voltage difference $(V_{(1)11\text{-}12}+V_{off2})-(V_{(1)13\text{-}14}+V_{off1})$ provided to both ends (Step 304). Here, an amplification rate a of the voltage amplifier 4 is equal to 1 and a relative error are regarded as being included in $V_{(1)11\text{-}12}$ and/or $V_{(1)13\text{-}14}$, for the sake of simplifying the formula.

Since the switch devices 61B and 62B are open and the switch device 74A is closed, one end of the storage device 71 is connected with the minus sides of the threshold setting voltage sources 72 and 73. Since the switch device 91A is closed, the other end of the storage device 71 is applied with the output voltage of the comparator 8.

At this time, since the output terminal of the comparator 8 is connected with the minus input terminal thereof, the comparator 8 performs a buffer operation, and the storage device 71 is applied with a voltage obtained by adding an input offset $V_{off3}$ of the comparator 8 to the voltage $V_{HYS}$ ($=V_{HYS1}$ or $V_{HYS2}$) to be applied to the plus input terminal (Step 305).

The latch circuit 10 outputs an output signal Q latched in the previous second period. When the output terminal of the latch circuit 10 is High, the output of the logic device 77 becomes High, whereas the output terminal of the latch circuit 10 is Low, the output of the logic device 78 becomes High. When either the logic device 77 or 78 becomes High in the first period, either the switch device 75 or 76 is closed, and then the plus terminal of either the threshold setting voltage source 72 or 73 is applied to the plus input terminal of the comparator 8.

Upon switching of the first signal "a" from High to Low, the switch devices 21A, 22A, 23A, 24A, 31A, 32A, 52A, 74A, 75, 76 and 91A open (Step 306).

Next, the second period (FIG. 4), in which the second signal "b" is High, is described. When the first signal "b" is High, the switch devices 21B, 22B, 23B, 24B, 31B, 32B, 61B and 62B are conducted (Step 401).

Due to the conduction of the switch device 21B and the switch device 23B, the GND terminal is connected with the resistor 11, and the resistor 12 is connected with the input terminal VIN1. Due to the conduction of the switch device 22B and the switch device 24B, the GND terminal is connected with the resistor 13, and the resistor 14 is connected with the input terminal VIN2.

A first divided voltage $V_{(2)11\text{-}12}$ is outputted from the connecting point between the resistor 11 and the resistor 12, and a second divided voltage $V_{(2)13\text{-}14}$ is outputted from the connecting point between the resistor 13 and the resistor 14 (Step 402).

Due to the conduction of the switch device 31B, the first operational amplifier 41 inputs the first divided voltage $V_{(2)11\text{-}12}$. Due to the conduction of the switch device 32B, the second operational amplifier 42 inputs the second divided voltage $V_{(2)13\text{-}14}$.

A relative error of resistance is included in the first divided voltage and/or the second divided voltage. The operational amplifiers 41 and 42 of the voltage amplifier 4 input a voltage including the relative error in the second period.

The operational amplifiers 41 and 42 of the voltage amplifier 4 amplify an inputted voltage and then output the amplified voltage (Step 403). At this time, the operational amplifiers 41 and 42 output voltages added with the input offset voltages $V_{off1}$ and $V_{off2}$ of the respective operational amplifiers.

The output voltage of the operational amplifier 41 of the voltage amplifier 4 is applied to one end of the storage device 51. Since the switch device 52A is open and the switch device 62B is closed, the output voltage of the operational amplifier 42 of the voltage amplifier 4 is applied to the storage device 71.

If a voltage of the connecting portion between the output of the operational amplifier 41 and the storage device 51 is relatively a positive value with respect to the connecting portion between the storage device 51 and the switch device 52A, the output voltage of the operational amplifier 41 is further outputted as a positive value to the output of the operational amplifier 42. Therefore, the signal in the first period is added with the signal in the second period, and the obtained signal is outputted to both ends of the switch device 52A in the second period.

A voltage in the connecting point between the storage device 51, the switch device 52A and the switch device 61B is higher than the connecting point between the output of the operational amplifier 42 and the other end of the switch device 52A and the switch device 62B.

The storage device 51 outputs the sum of the voltage $(V_{(1)11-12}+V_{off2})-(V_{(1)13-14}+V_{off1})$ stored in the first period and the voltage $(V_{(2)11-12}+V_{off1}+Vr)$ given in the second period (here, an amplification rate $\alpha$ of the voltage amplifier 4 is equal to 1 ($\alpha$=1), for the sake of simplifying the formula). The plus input terminal of the comparator 8 inputs the voltage.

The storage device 71 outputs the sum of the voltage $(V_{HYS}+V_{off3})$ stored in the first period, and the voltage $(V_{(2)13-14}+V_{off2}+Vr)$ given in the second period. The minus input terminal of the comparator 8 inputs the voltage.

The comparator 8 compares the voltage (obtained by subtracting the voltage of the minus input terminal from the voltage of the plus input terminal) given to the input terminal pair with equal to or more than zero.

In other words, the comparator 8 compares the sum of the voltage stored in the storage device 51 in the first period and the voltage (obtained by subtracting the output voltage of the second operational amplifier 42 from the output voltage of the first operational amplifier 41) detected in the second period with equal to or more than a threshold voltage (Step 404).

Since having the input offset voltage $V_{off3}$, the comparator 8 is to compare a voltage value obtained by adding the input offset voltage $V_{off3}$ to the input voltage of the plus input terminal of the comparator 8: $(V_{(1)11-12}+V_{off2})-(V_{(1)13-14}+V_{off1})+(V_{(2)11-12}+V_{off1}+Vr)$ and then subtracting therefrom the input voltage of the minus input terminal of the comparator 8: $V_{HYS}+V_{off3}+(V_{(2)13-14}+V_{off2}+Vr)$ with equal to or more than zero.

When this is expressed by a formula, a voltage V (obtained by subtracting the voltage of the minus input terminal from the voltage of the plus input terminal) provided to the comparator 8 is expressed by the following formula (1):

$$V = V_{off3} + \{(V_{(1)11-12} + V_{off2}) - (V_{(1)13-14} + V_{off1}) + (V_{(2)11-12} + V_{off1})\} - \{V_{HYS} + V_{off3} + (V_{(2)13-14} + V_{off2})\} = V_{(1)11-12} + V_{(2)11-12} - (V_{(1)13-14} + V_{(2)13-14}) - V_{HYS} \quad (1)$$

When V=0, the formula (1) is expressed by the following formula (2):

$$V_{(1)11-12}+V_{(2)11-12}-(V_{(1)13-14}+V_{(2)13-14})=V_{HYS} \quad (2)$$

The formula (2) does not include the input offset voltages $V_{off1}$ and $V_{off2}$ of the first operational amplifier 41 and the second operational amplifier 42. When the input offset voltage of the voltage amplifier 4 constantly exists in the voltage output from the output terminal pair of the voltage amplifier 4 after the voltage amplifier 4 amplifies a voltage input from the input terminal pair, since the switch circuit 3 inverts the state of connection of the voltage detection circuit 1 with the first operational amplifier 41 as well as the second operational amplifier 42 in the first and second period, the input offset voltages of the first operational amplifier 41 and the second operational amplifier 42 have opposite polarities to both ends of the switch device 52A in the first and second periods. The input offset voltages $V_{off1}$ and $V_{off2}$ of the first operational amplifier 41 and the second operational amplifier 42 are cancelled in the comparator 8.

The voltage detection circuit of the present invention is capable of performing an accurate comparison operation by canceling the input offset voltages $V_{off1}$ and $V_{off2}$ of the voltage amplifier 4.

The formula (2) does not include the input offset voltage $V_{off3}$ of the comparator 8. By storage of the input offset voltage of the comparator 8 in the storage device 71 in the first period, this input offset voltage of the comparator 8 is cancelled when the comparator 8 compares voltages inputted from the plus input terminal and the minus input terminal in the second period, The voltage detection circuit of the present invention can cancel the input offset of the comparator 8 in the second period, to perform an accurate comparison operation with a threshold.

Since the switch circuit 2 inverts the polarities of the connections of the voltage divided circuit 1 with the input terminals VIN1, VIN2 and the GND terminal in the first and second periods, the relative error of each of the resistors 11, 12, 13 and 14 in the state where the polarity is inverted in the first and second periods is amplified by the voltage amplifier 4 to be output. The polarities of the relative errors become opposite to both ends of the switch device 52A in the first and second periods. In the comparator 8, the relative error included in each of the detection voltages: $V_{(1)11-12}$, $V_{(1)13-14}$, $V_{(2)11-12}$, and $V_{(2)13-14}$, is cancelled. This is demonstrated below.

For example, when the resistance value of the resistors 11 and 12 is "R", and the resistor 11 has a relative error "$\Delta R$", the first divided voltage $V_{(1)11-12}$ in the first period and the first divided voltage $V_{(2)11-12}$ in the second period are expressed as follows. Here, "V1" is a voltage inputted from the input terminal VIN1.

$$V_{(1)11-12}=V1/(2+\Delta R/R)$$

$$V_{(2)11-12}=V1\{(1+\Delta R/R)/(2+\Delta R/R)\}$$

The sum of the first divided voltage of the first serial resistor (resistors 11 and 12) in the first period and the first divided voltage thereof in the second period is expressed as follows, and it is found that the relative error is cancelled.

$$V_{(1)11-12} + V_{(2)11-12} = V1/(2+\Delta R/R) + V1\{(1+\Delta R/R)/(2+\Delta R/R)\} = V1$$

Similarly in the case of the second serial resistor (resistors 13 and 14), even when a relative error exists, the relative error is cancelled and $(V_{(1)13-14}+V_{(2)13-14})$ can be expressed by "V2" which is a voltage inputted from the input terminal VIN2.

Therefore, the following formula (3) can be derived from the formula (2):

$$V1-V2=V_{HYS} \quad (3)$$

As the formula (3) shows, when the comparator 8 compares an inputted voltage in the second period, the effective signal component (V1−V2) of the voltage detected by the voltage detection circuit 1 is double (detection voltage value in the first period+detection voltage value in the second period).

In practice, the formula (3) is changed to the following formula (4) in order for the voltage amplifier 4 to multiple an inputted voltage by a and then output the multiplied voltage:

$$\alpha \times (V1-V2)=V_{HYS} \quad (4)$$

The comparator 8 outputs the value High which is one of the binary voltages of the comparator 8 when a voltage provided to the input terminal pair is not less than zero (that is, when a detection voltage not lower than a threshold is detected). When the voltage provided to the comparator 8 is less than zero (that is, when the detection voltage is lower than the threshold), the comparator 8 outputs the value Low.

The latch circuit 10 latches the output signal of the comparator 8 upon the rise of a LATCH signal, to output the signal to the external output terminal OUT (Step 405).

Based on the output signal of the latch circuit 10, either the switch device 76 or the switch device 75 is closed, and either the first threshold setting voltage source 72 or the second threshold setting voltage source 73 is selected (Step 406).

When the second signal "b" switches from High to Low, the switch devices 21B, 22B, 23B, 24B, 31B, 32B, 61B and 62B open (Step 407).

As shown in FIG. 2, the first period (operation of FIG. 3) and the second period (operation of FIG. 4) are intermittently and alternately repeated. A waiting period is set in between the second period and the first period. In this waiting period, the latch circuit 10 holds the output signal latched in the second period. All the switch devices are opened and operations other than the operation of the latch circuit 10 within the voltage detection circuit are halted, thereby consumption of the electric power can be reduced.

As described, the voltage detection circuit according to the embodiment 1 of the present invention can high-accurately output a binary value expressing whether a detection voltage is larger than a threshold or not, without being influenced by relative errors of the resistors 11 to 14 constituting the voltage divider circuit 1, an input offset voltage of the voltage amplifier 4, and an input offset voltage of the comparator 8.

It is to be noted that, when the voltage amplifier 4 does not amplify a voltage, the voltage detection circuit may not include the voltage amplifier 4.

Embodiment 2

Figure 5:
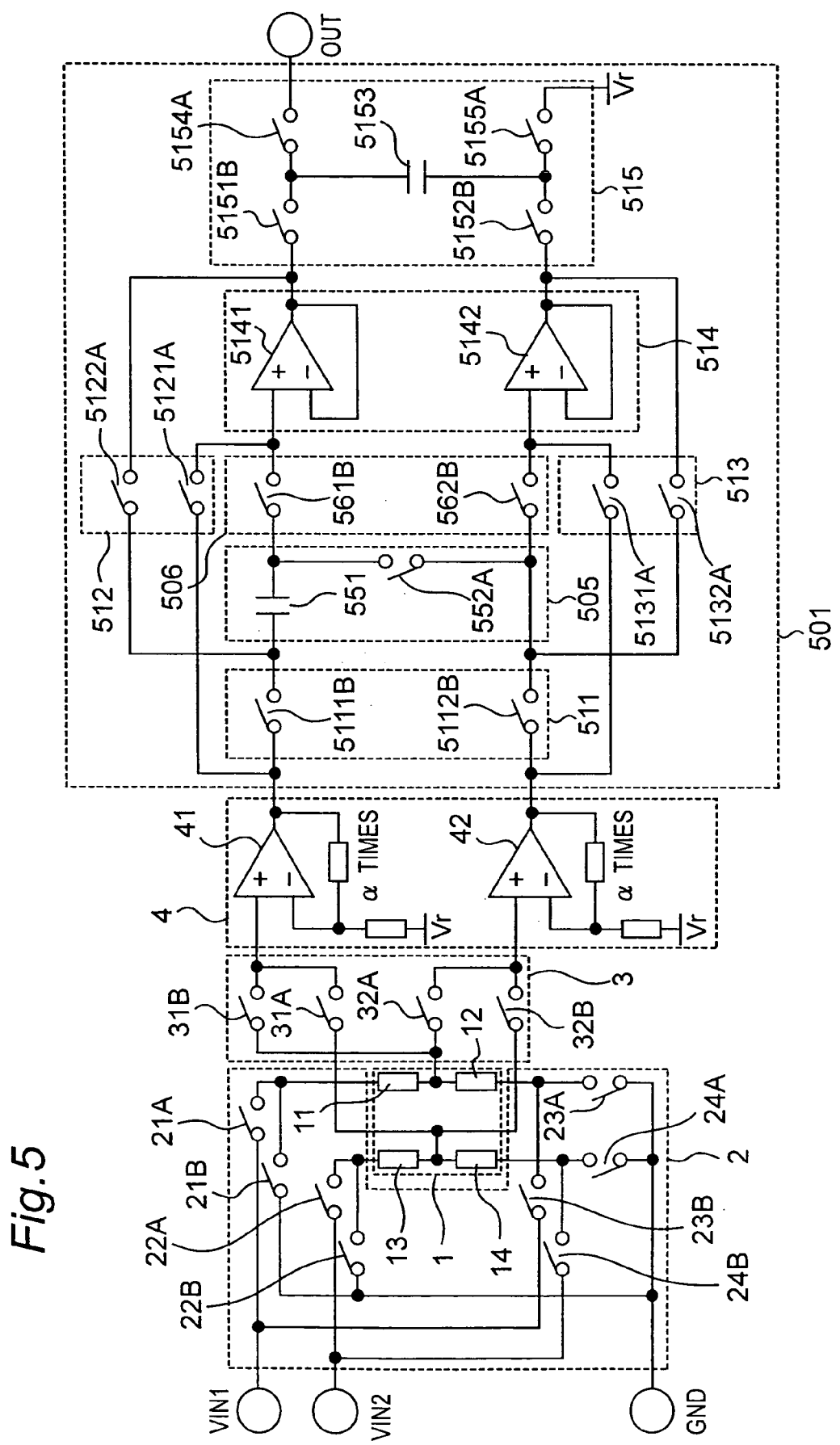
FIG. 5 is a block diagram showing a configuration of a voltage detection circuit according to an embodiment 2 of the present invention.

A voltage detection circuit and a voltage detection method according to an embodiment 2 of the present invention are described with reference to FIGS. 5 to 7. FIG. 5 is a block diagram showing the configuration of the voltage detection circuit according to the embodiment 2 of the present invention. Each of the circuits connected between the input terminals VIN1/VIN2 and the voltage detection circuit 4 in the voltage detection circuit of the embodiment 2 is equivalent to each of those circuits of the embodiment 1. Circuits connected between the voltage amplifier 4 and the external output terminal OUT in the voltage detection circuit of the embodiment 2 are different from the case of the embodiment 1.

In FIG. 5, the same constituents as those in FIG. 1 are provided with the same reference numbers as those in FIG. 1 and detailed descriptions of those constituents are omitted. Different constituents and operations according to the voltage detection circuit of the embodiment 2 from those of the embodiment 1 are described.

The voltage detection circuit of the embodiment 2 has a sampling circuit 501 between the voltage amplifier 4 and the external output terminal OUT.

The sampling circuit 501 (first sampling circuit) has a switch circuit 511 connected to the voltage amplifier 4, a storage circuit 505 (third storage circuit) connected to the switch circuit 511, a switch circuit 506 connected to the storage circuit 505, a buffer amplifier 514 (first operational amplifier) connected to the switch circuit 506, switch circuits 512 and 513, respectively connecting the input side of the switch circuit 511 with the input side of the buffer amplifier 514, and the output side of the switch circuit 511 with the output side of the buffer amplifier 514, and a storage circuit 515 (fourth storage circuit) connected between the buffer amplifier 514 and the external output terminal OUT. The switch circuits 506, 511, 512 and 513 constitute a fourth switch circuit.

The switch circuit 511 is constituted of a switch device 5111B which is closed to connect the output terminal of the first operational amplifier 41 with the storage device 551 in the second period, and a switch device 5112B which is closed to connect the second operational amplifier 42 with a switch device 552A and a switch device 562B in the second period.

The storage circuit 505 (third storage circuit) has the storage device 551, one end of which is connected to a switch device 5122A and the switch device 5111B, and the other end of which is connected to the switch devices 552A and 561B, and the switch device 552A, one end of which is connected between the switch devices 5112B and 562B, and the other end of which is connected to the storage device 551 and the switch device 561B.

The switch circuit 506 is constituted of two switch devices that are closed in the second period. The switch device 561B is connected between the storage device 551 and a plus input terminal of an operational amplifier 5141. The switch device 562B is connected between the switch device 5112B and a plus input terminal of an operational amplifier 5142.

The switch circuits 512 and 513 are each constituted of two switch devices which synchronize with the first signal "a" and close in the first period.

The switch device 5121A connects the output terminal of the operational amplifier 41 with the plus input terminal of the operational amplifier 5141. The switch device 5122A connects the connecting point between the switch device 5111B and the storage device 551 with the output terminal of the operational amplifier 5141.

A switch device 5131A connects the output terminal of the operational amplifier 42 with the plus input terminal of the operational amplifier 5142. A switch device 5132A connects the connecting point between the switch device 5112B and the switch device 552A with the output terminal of the operational amplifier 5142.

The buffer amplifier 514 is constituted of the two operational amplifiers 5141 and 5142.

The plus input terminal of the operational amplifier 5141 is connected to the switch device 5121A and the switch device 561B. The plus input terminal of the operational amplifier 5141 inputs the output voltage of the operational amplifier 41 via the switch device 5121A in the first period, and inputs a voltage obtained by adding the voltage of the storage device 551 to the output voltage of the operational amplifier 41 via the switch device 5111B and the switch device 561B in the second period.

The minus input terminal of the operational amplifier 5141 is connected to the output terminal of the operational amplifier 5141, and the operational amplifier 5141 performs a buffer operation.

The output terminal of the operational amplifier 5141 is connected to the switch device 5122A, and applies an output voltage to one end of the storage device 551 via the switch device 5122A in the first period.

The plus input terminal of the operational amplifier 5142 is connected to the switch device 5131A and the switch device 562B. The plus input terminal of the operational amplifier 5142 inputs the output voltage of the operational amplifier 42 via the switch device 5131A in the first period, and inputs the output voltage of the operational amplifier 42 via the switch device 5112B and the switch device 562B in the second period.

The minus input terminal of the operational amplifier 5142 is connected to the output terminal of the operational amplifier 5142, and the operational amplifier 5142 performs a buffer operation.

The output terminal of the operational amplifier 5142 is connected to the switch device 5132A, and applies an output voltage to the other end of the storage device 551 via the switch device 5132A and the switch device 552A in the first period.

As thus described, the output voltages of the operational amplifier 5141 and the operational amplifier 5142 are applied to both ends of the storage device 551, and the difference between those voltages is stored in the storage device 551 in the first period. The voltages stored in the storage device 551 include the relative errors of the resistors 11 to 14 in the voltage divider circuit 1, the input offset voltages of the operational amplifiers 41 and 42 of the voltage amplifier 4, and the input offset voltages of the operational amplifiers 5141 and 5142 of the buffer amplifier 514, in the first period.

The storage circuit 515 (fourth storage circuit) is constituted of four switch devices and one storage device.

A switch device 5151B and a switch device 5154A are connected in series to between the operational amplifier 5141 and the external output terminal OUT.

A switch device 5152B and a switch device 5155A are connected in series to between the operational amplifier 5142 and a reference voltage Vr.

One end of a storage device 5153 is connected between the switch device 5151B and the switch device 5154A, and the other end thereof is connected between the switch device 5152B and the switch device 5155A.

The switch device 5151B is closed in the second period and applies a voltage outputted from the output terminal of the operational amplifier 5141 to one end of the storage device 5153.

The switch device 5152B is closed in the second period and applies a voltage outputted from the output terminal of the operational amplifier 5142 to the other end of the storage device 5153.

Thereby, the storage device 5153 stores the difference between the voltages applied to both ends in the second period.

The switch device 5155A is closed to connect the storage device 5153 to the reference voltage Vr in the first period.

The switch device 5154A is closed to output a value, obtained by adding the voltage stored in the storage device 5153 to the reference voltage Vr, to the external output terminal OUT in the first period.

A voltage detection method is described below with reference to FIGS. 6 and 7, the method using the voltage detection circuit according to the embodiment 2 of the present invention, which is constituted as above described. FIG. 6 is a flow chart of the voltage detection method for the first period according to the embodiment 2 of the present invention. FIG. 7 is a flow chart of the voltage detection method for a second period according to the embodiment 2 of the present invention. In FIGS. 6 and 7, the same steps as those in FIGS. 1 and 2 of the embodiment 1 are provided with the same reference numbers as those in FIGS. 1 and 2, and detailed descriptions of those steps are omitted.

Figure 6:
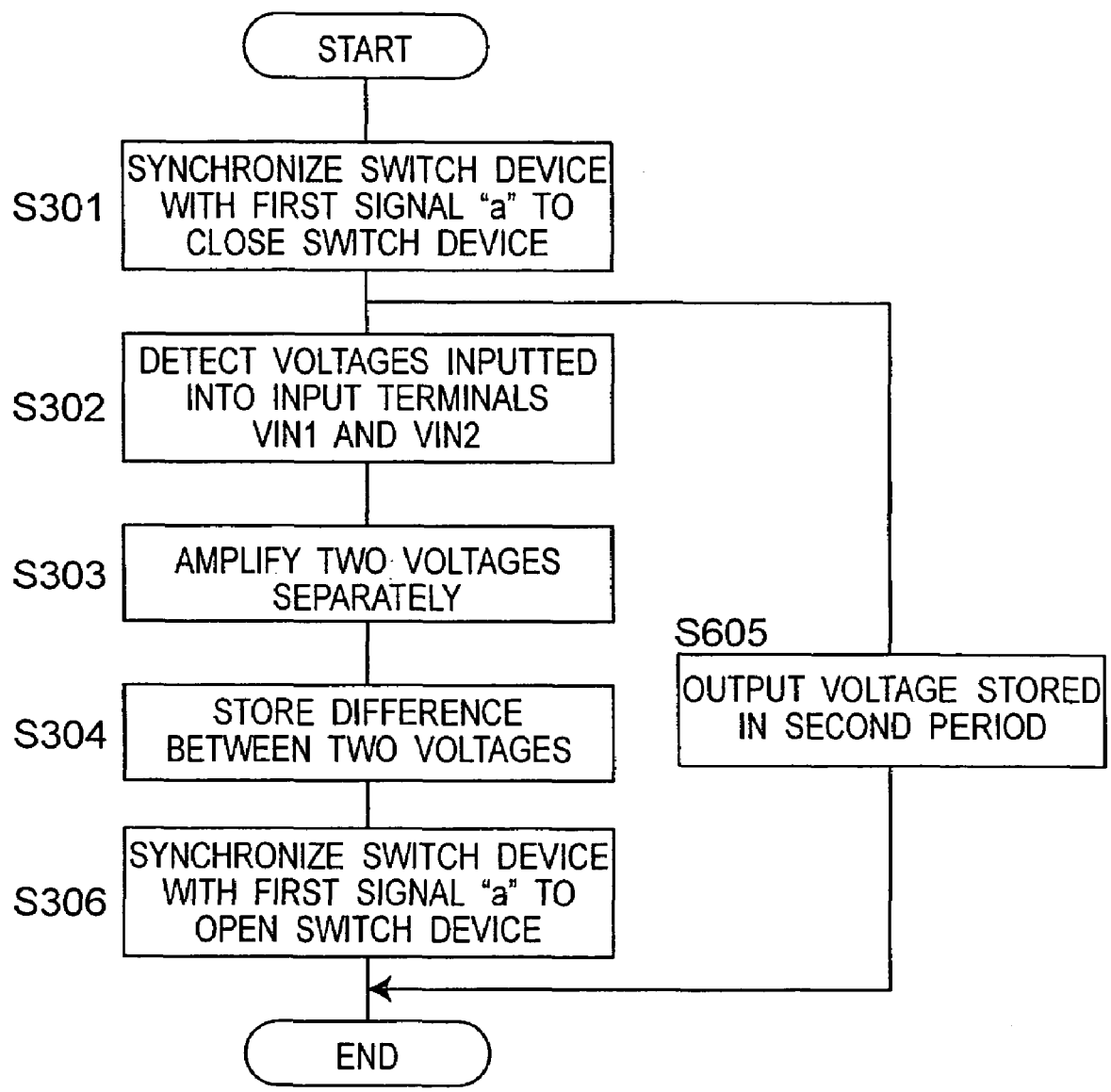
FIG. 6 is a flow chart for a first period of a voltage detection method according to the embodiment 2 of the present invention.
Figure 7:
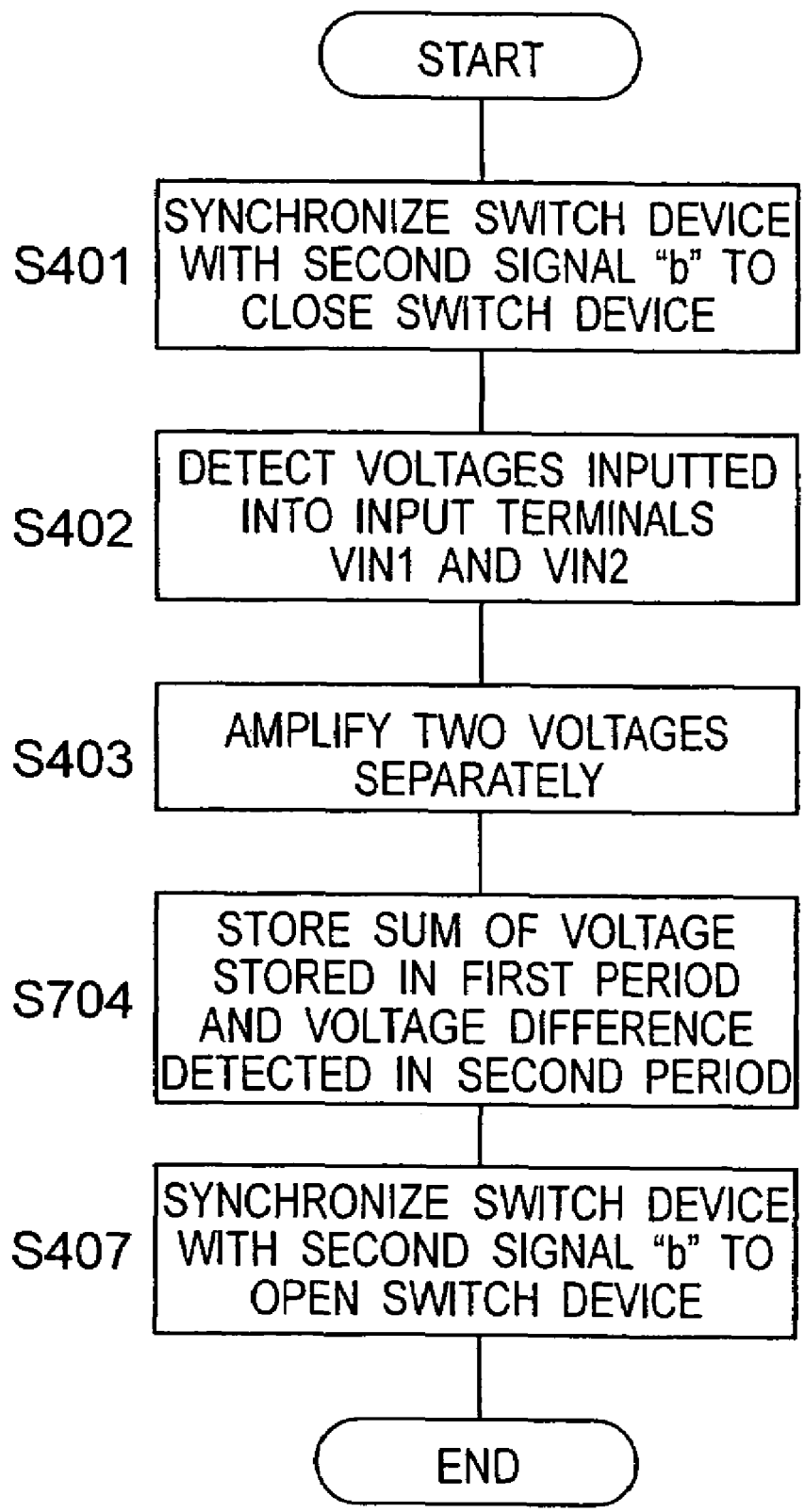
FIG. 7 is a flow chart for a second period of the voltage detection method according to the embodiment 2 of the present invention.

First, the first period, in which the first signal "a" is High, is described with-reference to FIG. 6. When the first signal "a" is High, the switch devices 5121A, 5122A, 5131A, 5132A, 552A, 5154A and 5155A are conducted (Step 301). The switch devices 5111B, 5112B, 561B, 562B, 5151B and 5152B are opened.

The operational amplifier 5141 inputs the output voltage of the operational amplifier 41 into the plus terminal thereof and outputs, from the output terminal thereof, a voltage obtained by adding an input offset voltage of the operational amplifier 5141 to the inputted voltage. This outputted voltage is applied to one end of the storage device 551. The other end of the storage device 551 is applied with a voltage obtained by adding the input offset voltage of the operational amplifier 5142 to the output voltage of the operational amplifier 42 (Step 304).

The voltage stored in the storage device 551 includes the relative errors of the resistors 11 to 14 in the voltage divider circuit 1, the input offset voltages of the operational amplifiers 41 and 42 of the voltage amplifier 4, and the input offset voltages of the operational amplifiers 5141 and 5142 of the buffer amplifier 514, in the first period.

In the period in which the second signal "b" is High, the switch devices 5111B, 5112B, 561B, 562B, 5151B and 5152B are conducted. The switch devices 5121A, 5122A, 5131A, 5132A, 552A, 5154A and 5155A are opened (Step 401).

The sum of the output voltage of the operational amplifier 41 and the voltage stored in the storage device 551 is applied to the plus input terminal of the operational amplifier 5141. A voltage outputted from the operational amplifier 5141 is the inputted voltage added with the input offset voltage of the operational amplifier 5141. The voltage outputted from the operational amplifier 5141 is applied to one end of the storage device 5153.

The operational amplifier 5142 inputs the output voltage of the operational amplifier 42 and outputs a voltage obtained by adding the input offset voltage of the operational amplifier 5142 to the inputted voltage. The output voltage of the operational amplifier 5142 is applied to the other end of the storage device 5153.

The output voltages of the operational amplifier 5141 and the operational amplifier 5142 are applied to both ends of the storage device 5153, and the storage device 5153 stores the difference between those voltages (Step 704).

According to the configuration of FIG. 5, the polarities of the relative errors of the resistors 11 to 14 in the voltage divider circuit 1, the polarities of the input offset voltages of the operational amplifiers 41 and 42 of the voltage amplifier 4, and the polarities of the input offset voltages of the operational amplifiers 5141 and 5142 of the buffer amplifier 514 are inverted between the first and second periods.

That is, the voltages stored in the storage device 5153 do not include the relative errors of the resistors 11 to 14 in the voltage divider circuit 1, the input offset voltages of the operational amplifiers 41 and 42 of the voltage amplifier 4, and the input offset voltages of the operational amplifiers 5141 and 5142 of the buffer amplifier 514.

The voltage stored in the storage device 5153 is expressed by $\alpha \times (V1-V2)$. ("$\alpha$" represents the amplification rate of the voltage amplifier 4, "V1" is a voltage inputted from the input terminal VIN1, and "V2" is a voltage inputted from the input terminal VIN2).

In the next first period, the switch devices 5151B and 5152B are opened, and the switch devices 5154A and 5155A are conducted. Thereby, the external output terminal OUT outputs a voltage obtained by adding the voltage stored in the storage device 5153 to the reference voltage Vr (Step 605).

Thus, the voltage detection circuit of the embodiment 2 can output a voltage (detection signal) proportional to a voltage difference detected by the voltage divider circuit 1 in the first period.

Embodiment 3

Figure 8:
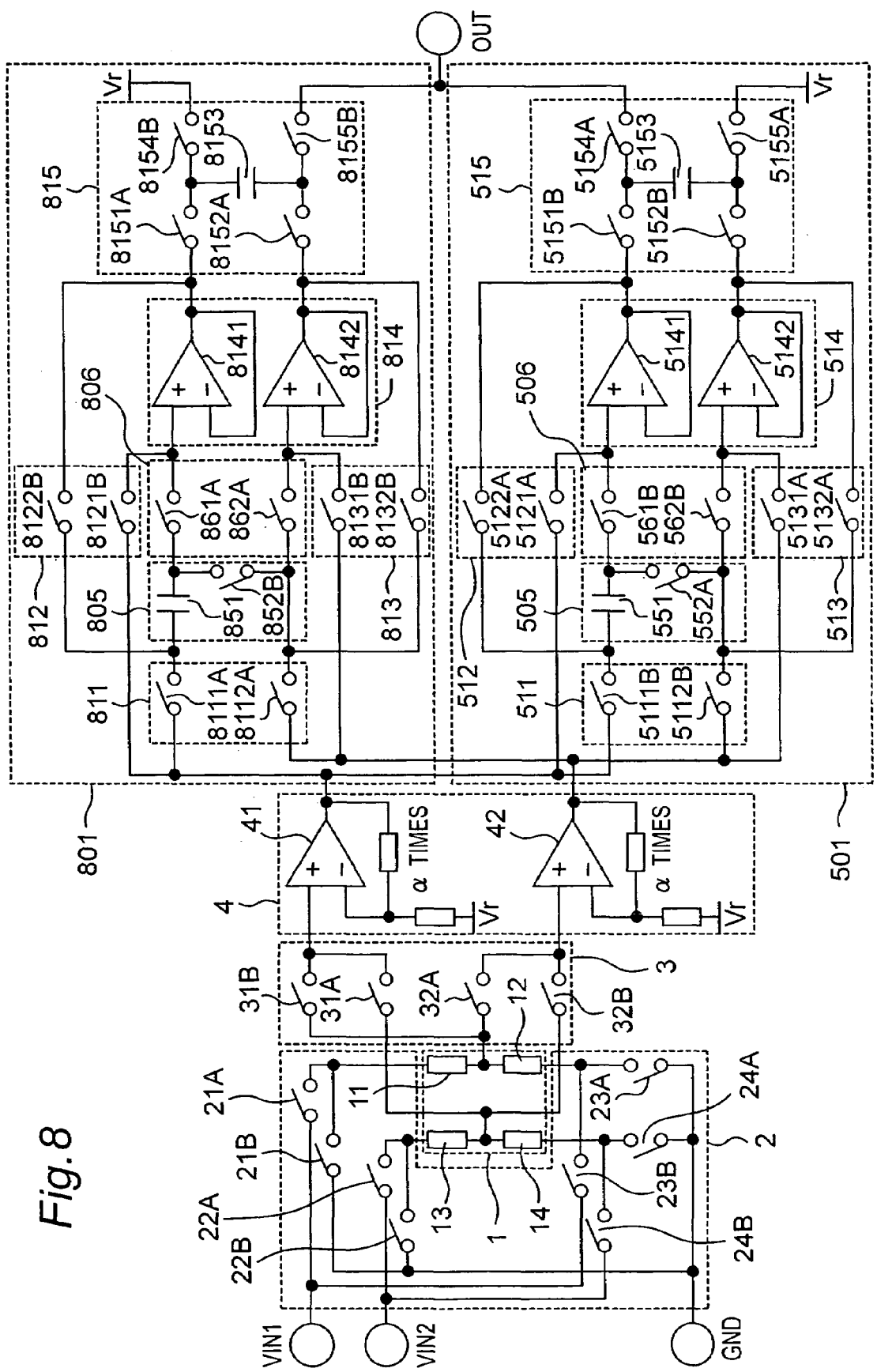
FIG. 8 is a block diagram showing a configuration of a voltage detection circuit according to an embodiment 3 of the present invention.

A voltage detection circuit and a voltage detection method according to an embodiment 3 of the present invention are described with reference to FIGS. 8 to 10. FIG. 8 is a block diagram showing the configuration of the voltage detection circuit according to the embodiment 3 of the present invention. Each of the circuits connected between the input terminals VIN1/VIN2 and the voltage detection circuit 4 in the voltage detection circuit of the embodiment 3 is equivalent to each of those circuits of the embodiments 1 and 2. Circuits connected between the voltage amplifier 4 and the external output terminal OUT in the voltage detection circuit of the embodiment 3 are different from the cases of the embodiments 1 and 2.

In FIG. 8 of the embodiment 3, the same constituents as those in FIG. 1 of the embodiment 1 or FIG. 5 of Embodiment 2 are provided with the same reference numbers as those in FIG. 1 or 5, and detailed descriptions of those constituents are omitted. Different constituents and operations in the voltage detection circuit of the embodiment 3 from those of the embodiments 1 and 2 are described.

The voltage detection circuit of the embodiment 3 is different from the voltage detection circuit of the embodiment 2 in that a sampling circuit 801 connected in parallel to the sampling circuit 501 is added.

The sampling circuit 801 (second sampling circuit) has a switch circuit 811 connected to the voltage amplifier 4, a storage circuit 805 (fifth storage circuit) connected to the switch circuit 811, a switch circuit 806 connected to a storage circuit 805, a buffer amplifier 814 (second operational amplifier) connected to the switch circuit 806, switch circuits 812 and 813, respectively connecting the input side of the switch circuit 811 with the input side of the buffer amplifier 814, and the output side of the switch circuit 811 with the output side of the buffer amplifier 814, and a storage circuit 815 (sixth storage circuit) connected between the buffer amplifier 814 and the external output terminal OUT. The switch circuits 806, 811, 812 and 813 constitute a fifth switch circuit.

Each input terminal of the buffer amplifier 814 within the sampling circuit 801 is in the same state of connection as the buffer amplifier 514 in the sampling circuit 501, and connected to each output terminal of the voltage amplifier 4. The storage circuit 815 in the sampling circuit 801 is in the opposite state of connection to the storage circuit 515 in the sampling circuit 501, and connected to the external output terminal OUT.

The switch circuit 811 has a switch device 8111A which is closed to connect the output terminal of the first operational amplifier 41 with the storage device 851 in the first period, and a switch device 8112A which is closed to connect the second operational amplifier 42 with a switch device 852B and a switch device 862A in the first period.

The storage circuit 805 (fifth storage circuit) has the storage device 851 which is connected between a switch device 8111A and the switch device 861A and the switch device 852B, one end of which is connected between the switch devices 8112A and 862A, and the other end of which is connected to the storage device 851 and the switch device 861A. The switch device 852B synchronizes with the second signal "b" to close in the second period.

The switch circuit 806 is constituted of two switch devices that are closed in the first period. The switch device 861A is connected between the storage device 851 and a plus input terminal of an operational amplifier 8141. The switch device 862A is connected between the switch device 8112A and a plus input terminal of an operational amplifier 8142.

The switch circuits 812 and 813 are each constituted of two switch devices which synchronize with the second signal "b" to close in the second period.

The switch device 8121B connects the output terminal of the operational amplifier 41 with the plus input terminal of the operational amplifier 8141. The switch device 8122B connects the connecting point between the switch device 8111A and the storage device 851 with the output terminal of the operational amplifier 8141.

A switch device 8131B connects the output terminal of the operational amplifier 42 with the plus input terminal of the operational amplifier 8142. A switch device 8132B connects the connecting point between the switch device 8112A and the switch device 852B with the output terminal of the operational amplifier 8142.

Thereby, the storage device 851 in the storage circuit 805 stores the difference between the output voltages of the operational amplifier 41 and the operational amplifier 42 in the second period.

The buffer amplifier 814 (second operational amplifier) is constituted of the two operational amplifiers 8141 and 8142.

The plus input terminal of the operational amplifier 8141 is connected to the switch device 8121B and the switch device 861A. The plus input terminal of the operational amplifier 8141 inputs a voltage obtained by adding the output voltage of the storage device 851 to the output voltage of the operational amplifier 41 via the switch device 8111A and the switch device 861A in the first period, and inputs the output voltage of the operational amplifier 41 via the switch device 8121B in the second period.

The minus input terminal of the operational amplifier 8141 is connected to the output terminal of the operational amplifier 8141, and the operational amplifier 8141 performs a buffer operation.

The output terminal of the operational amplifier 8141 is connected to the switch device 8122B, and applies an output voltage to one end of the storage device 851 via the switch device 8122B in the second period.

The plus input terminal of the operational amplifier 8142 is connected to the switch device 8131B and the switch device 862A. The plus input terminal of the operational amplifier 8142 inputs the output voltage of the operational amplifier 42 via the switch device 8112A and the switch device 862A in the first period, and inputs the output voltage of the operational amplifier 42 via the switch device 8131B in the second period.

The minus input terminal of the operational amplifier 8142 is connected to the output terminal of the operational amplifier 8142, and the operational amplifier 8142 performs a buffer operation.

The output terminal of the operational amplifier 8142 is connected to the switch device 8132B, and applies an output voltage to the other end of the storage device 851 via the switch device 8132B and the switch device 852B in the second period.

Thus, the output voltages of the operational amplifier 8141 and the operational amplifier 8142 are applied to both ends of the storage device 851, and the storage device 851 stores the difference between those voltages in the second period.

The voltages stored in the storage device 851 include the relative errors of the resistors 11 to 14 in the voltage divider circuit 1, the input offset voltages of the operational amplifiers 41 and 42 of the voltage amplifier 4, and the input offset voltages of the operational amplifiers 8141 and 8142 of the buffer amplifier 814, in the second period.

The storage circuit 815 (sixth storage circuit) is constituted of four switch devices and one storage device.

A switch device 8151A and a switch device 8154B are connected in series to between the operational amplifier 8141 and the reference voltage Vr.

A switch device 8152A and a switch device 8155B are connected in series to between the operational amplifier 8142 and the external output terminal OUT.

One end of a storage device 8153 is connected between the switch device 8151A and the switch device 8154B, and the other end thereof is connected between the switch device 8152A and the switch device 8155B.

The switch device 8151A is closed in the first period and a voltage outputted from the output terminal of the operational amplifier 8141 is applied to one end of the storage device 8153.

The switch device 8152A is closed in the first period and a voltage outputted from the output terminal of the operational amplifier 8142 is applied to the other end of the storage device 8153.

Thereby, the storage device 8153 stores the difference between the voltages applied to both ends in the first period.

The switch device 8154B is closed to be connected to the reference voltage Vr in the second period.

The switch device 8155B is closed in the second period to output a value obtained by adding the voltage stored in the storage device 8153 to the reference voltage Vr to the external output terminal OUT.

A voltage detection method using the voltage detection circuit according to the embodiment 3 of the present invention is described. FIG. 9 is a flow chart for the first period of the voltage detection method according to the embodiment 3 of the present invention. FIG. 10 is a flow chart for the second period of the voltage detection method according to the embodiment 3 of the present invention. In FIGS. 9 and 10, the same steps as those in FIGS. 6 and 7 of the embodiment 2 are provided with the same reference numbers as those in FIGS. 6 and 7, and detailed descriptions of those steps are omitted.

First, the first period (FIG. 9), in which the first signal "a" is High, is described. In the period when the first signal "a" is High, the switch devices 861A, 862A, 8111A, 8112A, 8151A and 8152A in the sampling circuit 801 are conducted (Step 301). The switch devices 8121B, 8122B, 8131B, 8132B, 852B, 8154B and 8155B are opened.

The output voltage of the operational amplifier 41 and the voltage stored in the storage device 851 are applied to the plus input terminal of the operational amplifier 8141. A voltage outputted from the operational amplifier 8141 is applied to one end of the storage device 8153. The voltage outputted from the operational amplifier 8141 includes the input offset voltage of the operational amplifier 8141.

The output voltage of the operational amplifier 42 is applied to the plus input terminal of the operational amplifier 8142. A voltage outputted from the operational amplifier 8142 is applied to the other end of the-storage device 8153. The voltage outputted from the operational amplifier 8142 includes the input offset voltage of the operational amplifier 8142.

In the first period, the storage device 8153 in the sampling the circuit 801 stores the difference between the voltages outputted from the operational amplifier 8141 and the operational amplifier 8142 (Step 904).

According to the configuration of FIG. 8, the polarities of the relative errors of the resistors 11 to 14 in the voltage divider circuit 1, the polarities of the input offset voltages of the operational amplifiers 41 and 42 of the voltage amplifier 4, and the polarities of the input offset voltages of the operational amplifiers 8141 and 8142 in the buffer amplifier 814 are inverted between the first and second periods.

That is, the voltage stored in the storage device 8153 do not include the relative errors of the resistors 11 to 14 in the voltage divider circuit 1, the input offset voltages of the operational amplifiers 41 and 42 in the voltage amplifier 4, and the input offset voltages of the operational amplifiers 8141 and 8142 in the buffer amplifier 814.

The voltage stored in the storage device 8153 is expressed by $\alpha \times (V1-V2)$. ("$\alpha$" represents the amplification rate of the voltage amplifier 4).

As described according to the embodiment 2, the sampling circuit 501 outputs a value obtained by adding the voltage stored in the storage device 5153 to the reference voltage Vr to the external output terminal OUT in the first period (Step 605).

In the period when the second signal "b" is High, the switch devices 8121B, 8122B, 8131B, 8132B, 852B, 8154B and 8155B in the sampling circuit 801 are conducted (Step 401). The switch devices 861A, 862A, 8111A, 8112A, 8151A and 8152A are opened.

The voltage stored in the storage device 8153 in the first period is added to the reference voltage Vr, and the obtained voltage is outputted from the external output terminal OUT (Step 1005).

The output voltages of the operational amplifier 8141 and the operational amplifier 8142 are applied to both ends of the storage device 851 (Step 1004). The voltage applied to this storage device 851 is applied to one end of the storage device 8153 along with the output voltage of the operational amplifier 41 in the next first period.

As described according to the embodiment 2, the sampling circuit 501 stores the voltage in the storage device 5153 in the second period (Step 704).

As thus described, the voltage detection circuit of Embodiment 3 outputs a voltage from the sampling circuit 501 in the first period (Step 605), and outputs a voltage from the sampling circuit 801 in the second period (Step 1005). The voltage detection circuit of the embodiment 3 is capable of outputting a voltage (detection signal) from the external output terminal OUT both in the first and second periods.

Embodiment 4

Figure 11:
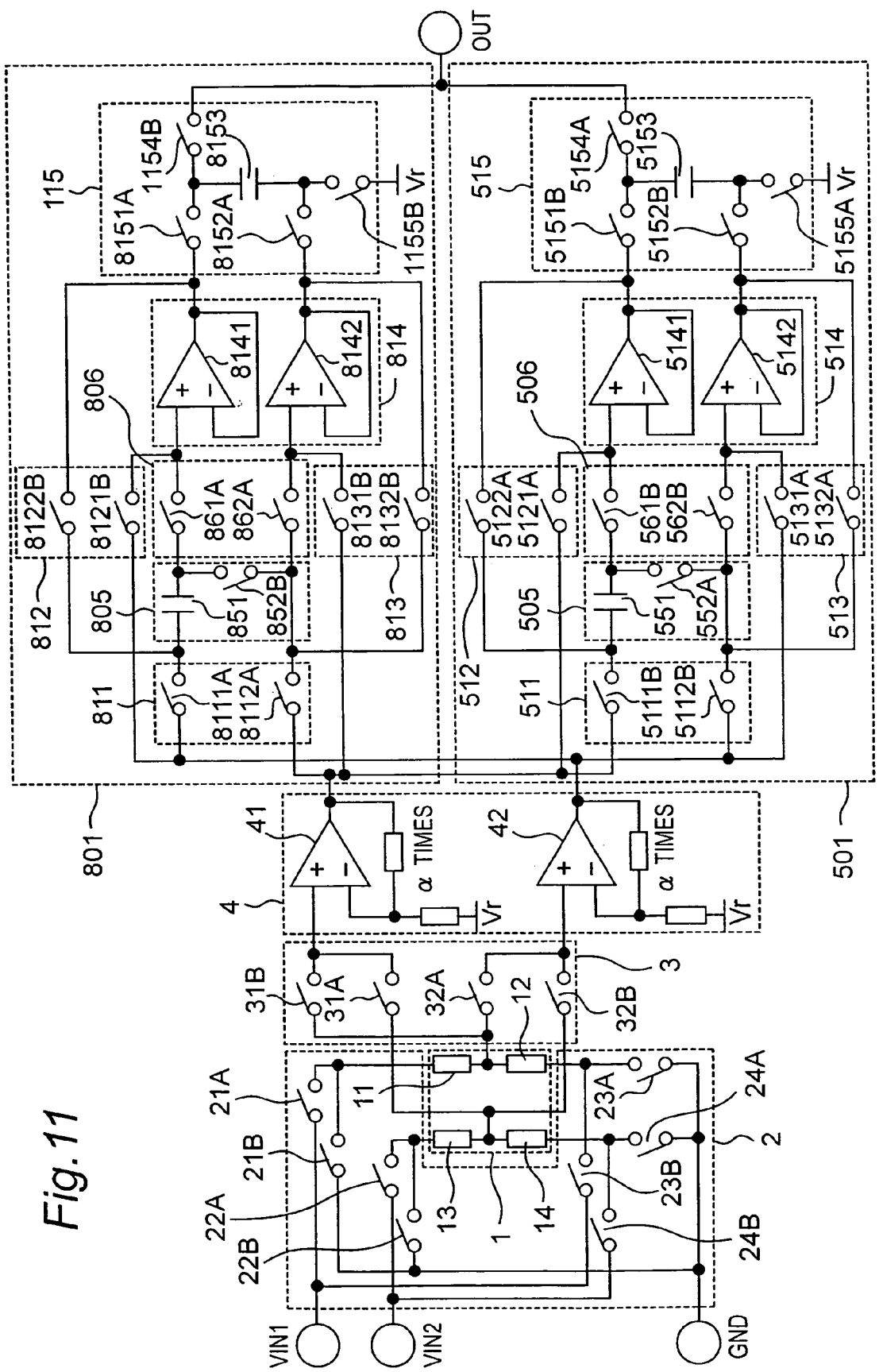
FIG. 11 is a block diagram showing a configuration of a voltage detection circuit according to an embodiment 4 of the present invention.

A voltage detection circuit and a voltage detection method according to an embodiment 4 of the present invention are described with reference to FIG. 11. FIG. 11 is a block diagram showing the configuration of the voltage detection circuit according to the embodiment 4 of the present invention. The input and output connections of the sampling circuit 801 in the voltage detection circuit of the embodiment 4 are different from the case of the embodiment 3. Other than such connections, the configuration of the voltage detection circuit of the embodiment 4 is equivalent to that of the embodiment 3.

In FIG. 11 of the embodiment 4, the same constituents as those in FIG. 1 of the embodiment 1, FIG. 5 of the embodiment 2 and FIG. 8 of the embodiment 3 are provided with the same reference numbers as those in FIGS. 1, 5 and 8, and detailed descriptions of those constituents are omitted. Different constituents and operations in the voltage detection circuit of the embodiment 4 from those of the embodiment 3 are described.

In the embodiment 4, each input terminal of the buffer amplifier 814 within the sampling circuit 801 is in the opposite state of connection to the buffer amplifier 514 in the sampling circuit 501, and connected to each output terminal of the voltage amplifier 4. The switch circuits 811, 812 and 813 are connected such that the operational amplifier 8141 inputs the output voltage of the operational amplifier 42 and the operational amplifier 8142 inputs the output voltage of the operational amplifier 41.

In the embodiment 4, the storage circuit 115 in the sampling circuit 801 is in the same state of connection as the storage circuit 515 in the sampling circuit 501, and connected to the external output terminal OUT. That is, in the sampling circuits 501 and 801 in the voltage detection circuit of the embodiment 4, the states of the connections of one end of the storage device 5153 in the switch circuit 515 with the external output terminal OUT and the other end thereof with the reference voltage Vr are the same as those of one end of the storage device 8153 in the switch circuit 115 with the external output terminal OUT and the other end thereof with the reference voltage Vr. The switch device 1154B is connected to the external output terminal OUT, and the switch device 1155B is connected to the reference voltage Vr.

Figure 9:
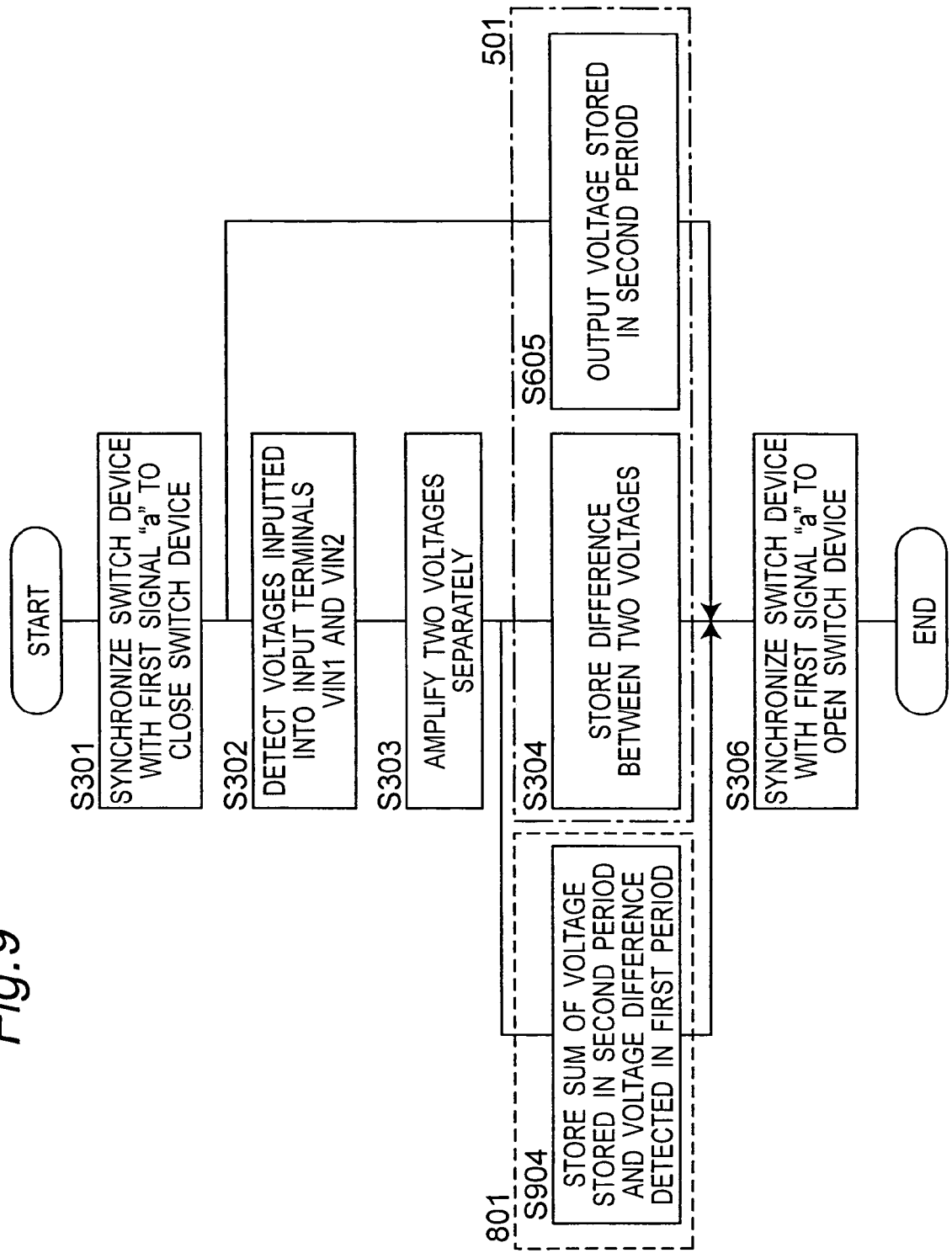
FIG. 9 is a flow chart for a first period of a voltage detection method according to the embodiment 3 of the present invention.
Figure 10:
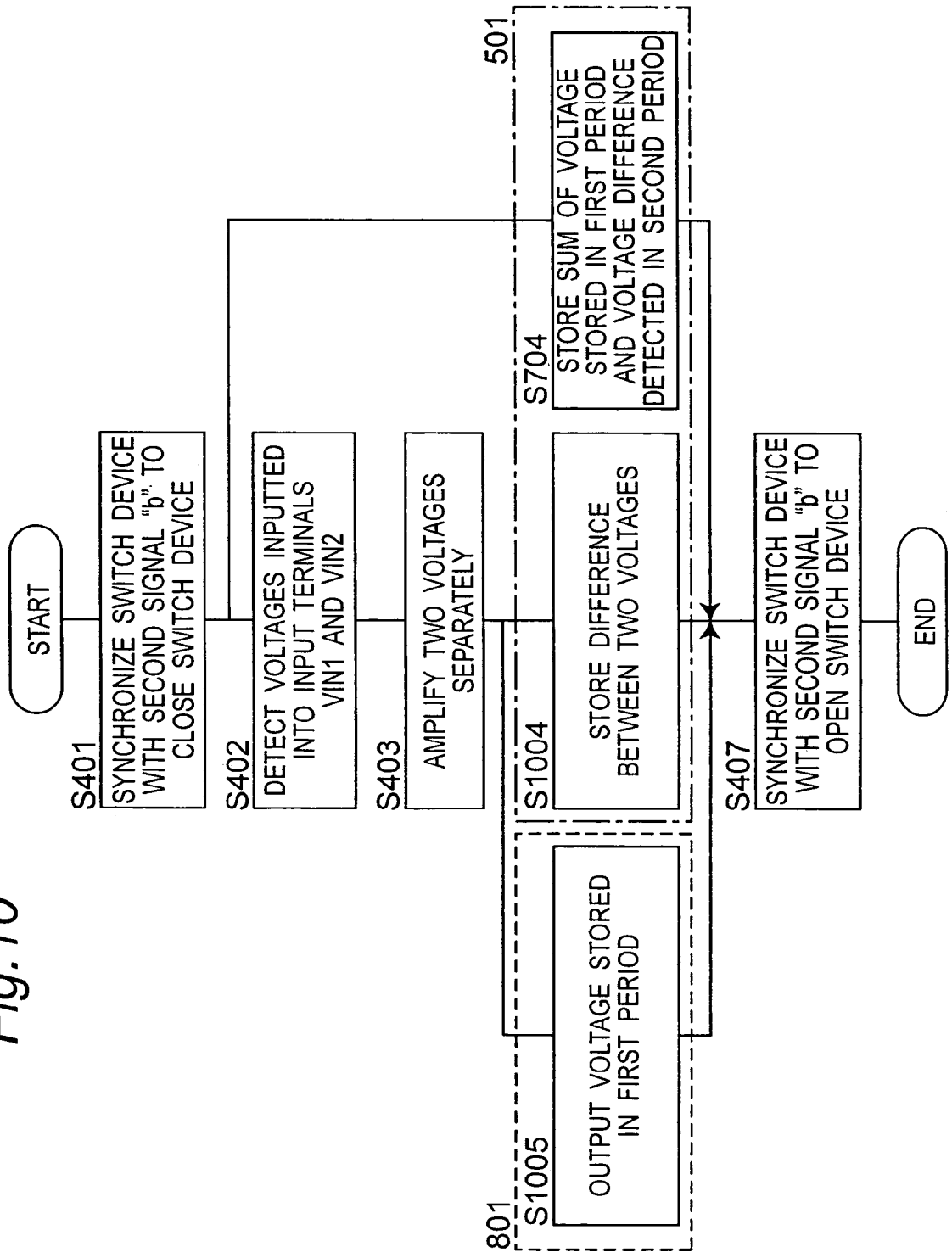
FIG. 10 is a flow chart for a second period of the voltage detection method according to the embodiment 3 of the present invention.

The voltage detection circuit of the embodiment 4 performs the same operations as those of the voltage detection method of the embodiment 3 shown in FIG. 9 (first period) and FIG. 10 (second period). The voltage detection circuit and the voltage detection method of the embodiment 4 have the same effect as in the embodiment 3.

Embodiment 5

Figure 12:
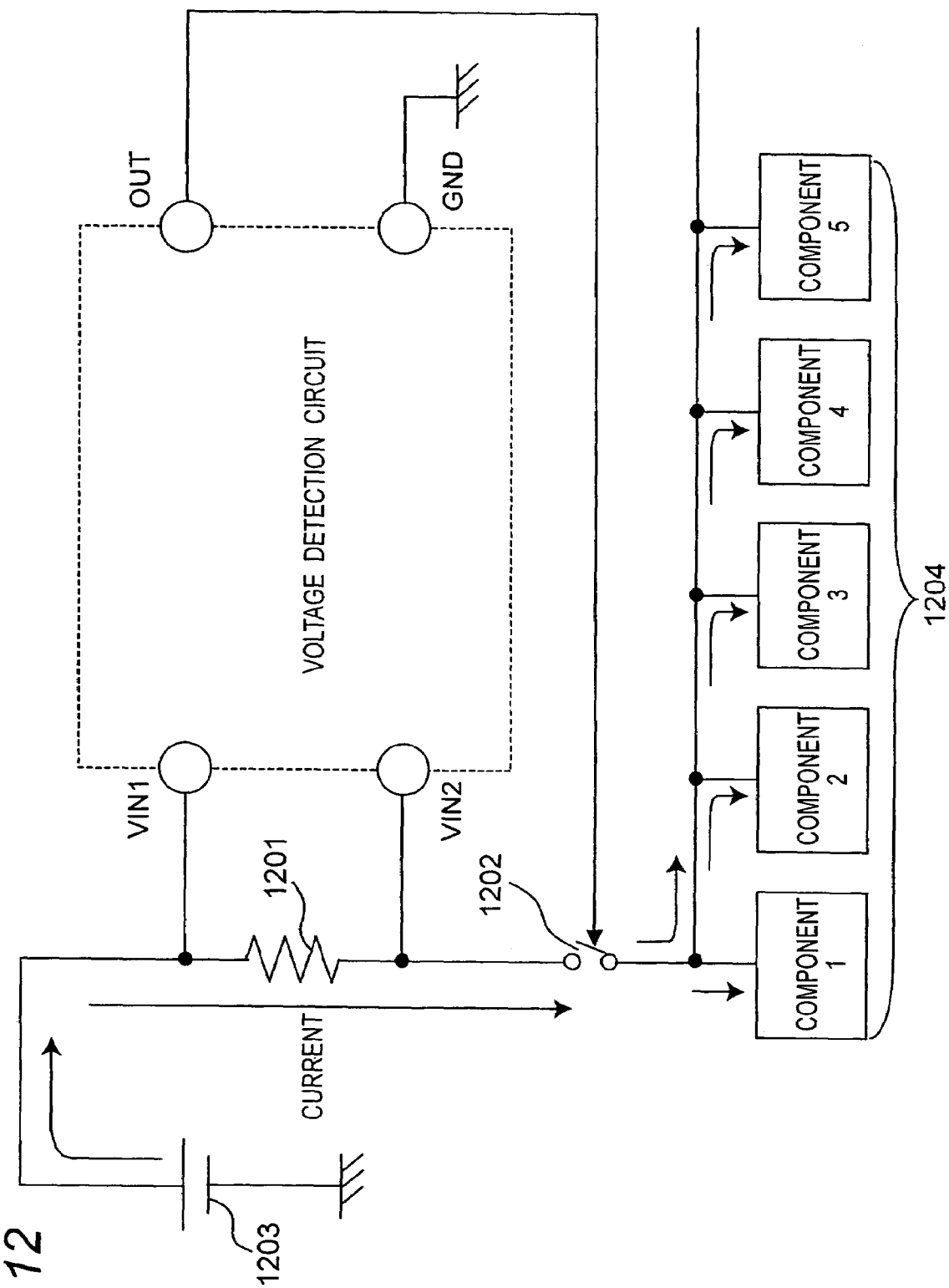
FIG. 12 is a block diagram showing a configuration of an overcurrent detection circuit according to an embodiment 5 of the present invention.

An overcurrent detection circuit according to an embodiment 5 of the present invention is described with reference to FIG. 12. FIG. 12 is a block diagram showing the configuration of the overcurrent detection circuit according to the embodiment 5 of the present invention. The overcurrent detection circuit of the embodiment 5 has a detection resistor 1201 and a switch device 1202, which are connected in series to between a charging battery 1203 and each of components 1204 of a mobile phone, and the voltage detection circuit of FIG. 1 (Embodiment 1) for detecting voltages of both ends of the detection resistor 1201.

The overcurrent detection circuit of the embodiment 5 is a circuit for preventing an overcurrent from flowing from the charging battery 1203 to each of the components 1204 and thus from destroying each of the components. This overcurrent detection circuit is built into the mobile phone.

A resistance value of the detection resistor 1201 is minute. In the voltage detection circuit of FIG. 1, the voltages of both ends of the detection resistor 1201 are inputted into the input terminal VIN1 and the input terminal VIN2. As described in the embodiment 1, the voltage detection circuit cancels the relative errors of the resistors 11 to 14 and the input offset voltages of the operational amplifiers 41 and 42 and the comparator 8, to output the binary output signal of High or Low.

The switch device 1202 switches on or off based on an output signal of the voltage detection circuit. When the output signal is High, the switch device 1202 is turned off. When the output signal is Low, the switch device 1202 is turned on. This enables prevention of an overcurrent from flowing from the charging battery 1203 to each of the components 1204.

Embodiment 6

Figure 13:
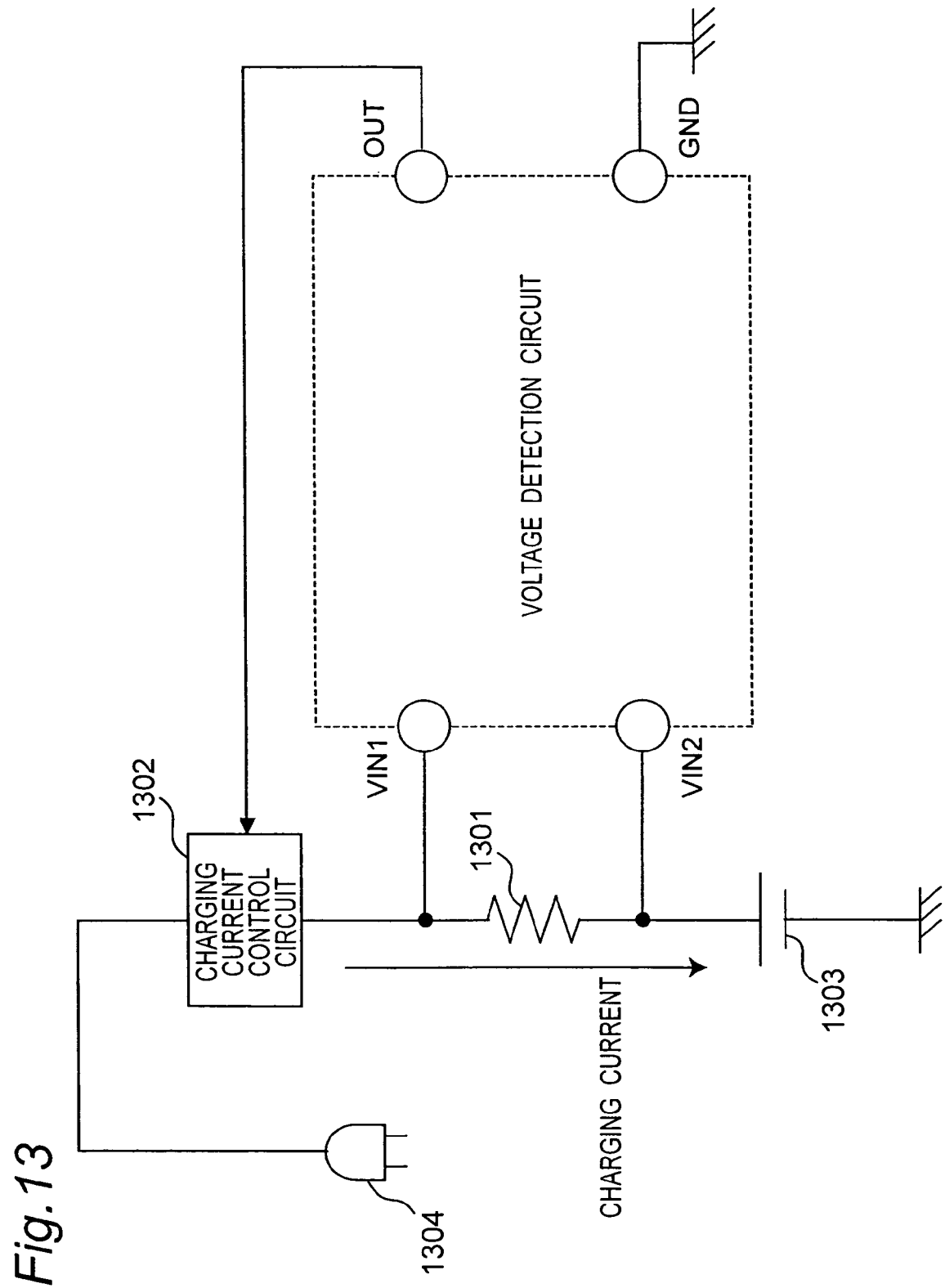
FIG. 13 is a block diagram showing a configuration of a charging current control system according to an embodiment 6 of the present invention.

A charging current control system according to an embodiment 6 of the present invention is described with reference to FIG. 13. FIG. 13 is a block diagram showing the configuration of the charging current control system according to the embodiment 6 of the present invention. The charging current control system of the embodiment 6 has a charging current control circuit 1302 and a detection resistor 1301 which are connected in series to between an external power source 1304 and a charging battery 1303, and the voltage detection circuit of FIG. 5 (Embodiment 2).

A resistance value of the detection resistor 1301 is small. In the voltage detection circuit shown in FIG. 5, voltages of both ends of the detection resistor 1301 are inputted into the input terminal VIN1 and the input terminal VIN2. As described in the embodiment 2, the voltage detection circuit of FIG. 5 cancels the relative errors of the resistors 11 to 14, the input offset voltages of the operational amplifiers 41, 42 and the operational amplifiers 5141, 5142, to output a voltage (detection signal) proportional to the inputted voltage difference.

The charging current control circuit 1302 controls a value of a charging current flowing from the external source to the charging battery based on a value of a detection signal of the voltage detection circuit so as to provide a voltage corresponding to a fully charged voltage to the input terminal VIN1 and to keep the voltage constant.

When the battery voltage of the input terminal VIN2 increases, the value (voltage difference between VIN1 and VIN2) of the detection signal outputted from the voltage detection circuit is reduced. The charging current control circuit 1302 reduces a value of the charging current. The charging current control circuit 1302 phases out the charging current so as to become zero when the voltage difference between VIN1 and VIN2 becomes zero and to complete the charging operation. This enables prevention of the charging battery 1303 from being overcharged.

It is to be noted that, in the charging current control system of the embodiment 6, the voltage detection circuit of FIG. 8 (Embodiment 3) or the voltage detection circuit of FIG. 11 (Embodiment 4) may be employed in place of the voltage detection circuit of FIG. 5 (Embodiment 2). Even in such a case, the charging current control circuit 1302 is capable of controlling a charging current flowing from the external power source to the charging battery based on a detection signal value of the voltage detection circuit.

The present invention is effective as a voltage detection circuit for high-accurately detecting a minute voltage value, an overcurrent detection circuit, a charging current control system and a voltage detection method.

Although the present invention has been described in connection with specified embodiments thereof, many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2004-317237, filed on Oct. 29, 2004, which is expressly incorporated herein by reference in its entirety.

What is claimed is:

1. A voltage detection circuit, comprising:
a first input terminal that inputs a first input voltage;
a second input terminal that inputs a second input voltage;
a third input terminal to provide a ground potential;
a voltage divider circuit having a first serial resistor and a second serial resistor, the first serial resister having a plurality of resistors connected in series and a first voltage dividing terminal at the intermediate connecting point of the plurality of resistors, the second serial resistor having a plurality of resistors connected in series and a second voltage dividing terminal at the intermediate connecting point of the plurality of resistors; and a first switch circuit including a first plurality of switches and a second plurality of switches, the first plurality of switches turning on or off based on a first signal for turning on the switches for a first period, the second plurality of switches turning on or off based on a second signal for turning on the switches for a second period, the second period being different from the first period, the first switch circuit switching the state of connection of each of the input terminals to the first serial resistor and the second serial resistor in the first period and the second period to reverse polarity of voltage inputted to the voltage divider circuit; wherein in the first period, the first plurality of switches of the first switch circuit connects the first input terminal to one end of the first serial resistor, connects the second input terminal to one end of the second serial resistor, and connects the third input terminal to the other end of the first serial resistor and the other end of the second serial resistor, and in the second period, the second plurality of switches of the first switch circuit connects the third input terminal to one end of the first serial resistor and one end of the second serial resistor, connects the first input terminal to the other end of the first serial resistor, and connects the second input terminal to the other end of the second serial resistor, and the voltage detection circuit detects a difference between the first input voltage and the second input voltage, based on the voltages output from the voltage divider circuit.

2. The voltage detection circuit according to claim 1, further comprising:

a voltage amplifier which inputs a voltage of each of the first voltage dividing terminal and the second voltage dividing terminal to amplify each inputted voltage; and a second switch circuit which inverts the state of connection of the first voltage dividing terminal and the second voltage dividing terminal to the voltage amplifier in the first period and the second period.

3. The voltage detection circuit according to claim 2, wherein a power source voltage of the voltage amplifier is the first input voltage.

4. The voltage detection circuit according to claim 2, further comprising:

a first storage circuit having a first switch device connected to one output terminal of the voltage amplifier and a first storage device connected between the other output terminal of the voltage amplifier and the first switch device.

5. The voltage detection circuit according to claim 4, further comprising:

a comparator having a positive electrode input terminal which inputs a voltage of one output terminal of the voltage amplifier via the first storage device, and a negative electrode input terminal which inputs a voltage of the other output terminal of the voltage amplifier, and a third switch circuit which is provided between the voltage amplifier and the comparator and controls an input into the comparator.

6. The voltage detection circuit according to claim 5, further comprising:

a second storage circuit having a second storage device connected between the third switch circuit and the negative electrode input terminal of the comparator, and a second switch device that connects the output terminal and the negative electrode input terminal of the comparator in the first period; and a threshold setting circuit that has one end which is connected to the second storage device and the other end of which is connected to the positive electrode input terminal of the comparator, and outputs a threshold voltage in the first period.

7. The voltage detection circuit according to claim 6, further comprising:

a latch circuit that has a data input terminal and a clock input terminal and an output terminal, wherein the data input terminal inputs the output of the comparator, and the clock input terminal inputs a latch signal for latching a signal inputted into the data input terminal in the second period.

8. The voltage detection circuit according to claim 7, wherein the threshold setting circuit inputs the output signal of the latch circuit to change the threshold voltage value based on the output signal of the latch circuit.

9. The voltage detection circuit according to claim 7, wherein the first period and the second period are intermittently alternately repeated, and a waiting period is set between the second period and the first period.

10. The voltage detection circuit according to claim 2, further comprising a first sampling circuit that has:

a first operational amplifier having two input terminals and two output terminals;

a third storage circuit connected to the voltage amplifier and the first operational amplifier;

a fourth switch circuit that switches connections so that, in the first period, each of the output terminals of the voltage amplifier is connected to each of the input terminals of the first operational amplifier and each of the output terminals of the first operational amplifier is connected to the third storage circuit, while, in the second period, a voltage of one of the output terminals of the voltage amplifier is inputted into one of the input terminals of the first operational amplifier via the third storage circuit and a voltage of the other of the output terminals of the voltage amplifier is inputted into the other of input terminals of the first operational amplifier; and a fourth storage circuit that is connected to the first operational amplifier to store a voltage difference between the two output terminals of the first operational amplifier in the second period, and output a value obtained by adding the voltage difference to a reference voltage to an external output terminal in the next first period.

11. The voltage detection circuit according to claim 10, further comprising a second sampling circuit that has:

a second operational amplifier having two input terminals and two output terminals;

a fifth storage circuit connected to the voltage amplifier and the second operational amplifier;

a fifth switch circuit that switches connections so that, in the second period, each of the output terminals of the voltage amplifier is connected to each of the input terminals of the second operational amplifier, and each of the output terminals of the second operational amplifier is connected to the fifth storage circuit, while, in the first period, a voltage of one of the output terminals of the voltage amplifier is inputted into one of the input terminals of the second operational amplifier via the fifth storage circuit and a voltage of the other of the output terminals of the voltage amplifier is inputted into the other of input terminals of the second operational amplifier; and a sixth storage circuit that is connected to the second operational amplifier to store a voltage difference between the two output terminals of the second operational amplifier in the first period and output a value obtained by adding the voltage difference to a reference voltage to the external output terminal in the second period.

12. The voltage detection circuit according to claim 11, wherein
each of the input terminals of the second operational amplifier is connected with each of the output terminals of the voltage amplifier in the same state of connection as the first operational amplifier, and
the sixth storage circuit is connected with the reference voltage and the external output terminal in the opposite state of connection to the fourth storage circuit.

13. The voltage detection circuit according to claim 11, wherein
each of the input terminals of the second operational amplifier is connected with each of the output terminals of the voltage amplifier in the opposite state of connection to the first operational amplifier, and
the sixth storage circuit is connected with the reference voltage and the external output terminal in the same state of connection as the fourth storage.

14. An overcurrent detection circuit, comprising:
a detection resistor provided between a charging battery and an equipment to be driven by applying with a voltage from the charging battery;
a third switch device connected in series with the detection resistor; and
the voltage detection circuit according to claim 7, which inputs voltages of both ends of the detection resistor and outputs a signal for controlling an open/close operations of the third switch device.

15. A charging current control system, comprising:
a charging battery which is supplied with a charging current from a external power source so as to be charged;
a charging current control circuit connected between the external power source and the charging battery;
a detection resistor connected in series with the charging current control circuit; and
the voltage detection circuit according to claim 10, which is connected with both ends of the detection resistor and outputs a detection signal based on the voltage across the detection resistor to the charging current control circuit;
wherein the charging current control circuit controls a value of the charging current based on the detection signal of the voltage detection circuit.

16. A charging current control system, comprising:
a charging battery which is supplied with a charging current from a external power source so as to be charged;
a charging current control circuit connected between the external power source and the charging battery;
a detection resistor connected in series with the charging current control circuit; and
the voltage detection circuit according to claim 11, which is connected with both ends of the detection resistor and outputs a detection signal based on the voltage of the detection resistor to the charging current control circuit;
wherein the charging current control circuit controls a value of the charging current based on the detection signal of the voltage detection circuit.

17. A voltage detection method by use of a voltage detection circuit comprising:
a first input terminal that inputs a first input voltage;
a second input terminal that inputs a second input voltage;
a third input terminal to provide a ground potential;
a voltage divider circuit having a first serial resistor and a second serial resistor, the first serial resistor having a plurality of resistors connected in series and a first voltage dividing terminal at the intermediate connecting point of the plurality of resistors, the second serial resistor having a plurality of resistors connected in series and a second voltage dividing terminal at the intermediate connecting point of the plurality of resistors; and
a first switch circuit including a first plurality of switches and a second plurality of switches, the first plurality of switches turning on or off based on a first signal for turning on the switches for a first period, the second plurality of switches turning on or off based on a second signal for turning on the switches for a second period, the second period being different from the first period,
wherein the voltage detection method comprises:
switching the state of connection of each of the input terminals to the first serial resistor and the second serial resistor in the first period and the second period by the first switch circuit to reverse polarity of voltage inputted to the voltage divider circuit; and
detecting a difference between the first input voltage and the second input voltage, based on the voltages output from the voltage divider circuit;
wherein the switching step comprises:
in the first period, by the first plurality of switches, connecting the first input terminal to one end of the first serial resistor, connecting the second input terminal to one end of the second serial resistor, and connecting the third input terminal to the other end of the first serial resistor and the other end of the second serial resistor; and
in the second period, by the second plurality of switches, connecting the third input terminal to one end of the first serial resistor and one end of the second serial resistor, connecting the first input terminal to the other end of the first serial resistor, and connecting the second input terminal to the other end of the second serial resistor.

18. The voltage detection method according to claim 17, further comprising:
inputting a voltage of each of the first voltage dividing terminal and the second voltage dividing terminal into a voltage amplifier, to amplify each inputted voltage; and
inverting the state of connection of the first voltage dividing terminal and the second voltage dividing terminal to the voltage amplifier by a second switch circuit in the first period and the second period.

19. The voltage detection method according to claim 18, further comprising: closing a first switch device connected to one of the output terminals of the voltage amplifier, to store a voltage to be outputted from the voltage amplifier into a first storage device connected between the first switch device and the other of output terminals of the voltage amplifier, in the first period.

20. The voltage detection method according to claim 19, further comprising:
switching a third switch circuit so as to input a voltage of one of the output terminals of the voltage amplifier into a positive electrode input terminal of a comparator via the first storage device, and input a voltage of the other of the output terminals of the voltage amplifier into a negative electrode input terminal of the comparator, in the second period; and comparing two inputted voltages by the comparator.

21. The voltage detection method according to claim 18, further comprising:
- in the first period, connecting each of the output terminals of the voltage amplifier to each of the input terminals of a first operational amplifier, and also connecting each of the output terminals of the first operational amplifier to a third storage circuit;
- in the second period, inputting a voltage of one of the output terminals of the voltage amplifier into one of the input terminals of the first operational amplifier via the third storage circuit, and also inputting a voltage of the other of the output terminals of the voltage amplifier into the other of input terminals of the first operational amplifier; and
- connecting a fourth storage circuit to the first operational amplifier to store a voltage difference between the two output terminals of the first operational amplifier in the second period, and then outputting a value obtained by adding the voltage difference to a reference voltage in the next first period.

22. The voltage detection method according to claim 21, further comprising:
- in the second period, connecting each of the output terminals of the voltage amplifier to each of the input terminals of a second operational amplifier, and also connecting each of the output terminals of the second operational amplifier to a fifth storage circuit;
- in the first period, inputting a voltage of one of the output terminals of the voltage amplifier into one of the input terminals of the second operational amplifier via the fifth storage circuit, and also inputting a voltage of the other of the output terminals of the voltage amplifier into the other of input terminals of the second operational amplifier; and
- connecting a sixth storage circuit to the second operational amplifier to store a voltage difference between the two output terminals of the second operational amplifier in the first period, and then outputting a value obtained by adding the voltage difference to a reference voltage in the second period.

* * * * *